(12) United States Patent
Hanson et al.

(10) Patent No.: US 7,252,714 B2
(45) Date of Patent: Aug. 7, 2007

(54) APPARATUS AND METHOD FOR THERMALLY CONTROLLED PROCESSING OF MICROELECTRONIC WORKPIECES

(75) Inventors: Kyle M. Hanson, Kalispell, MT (US); Robert W. Batz, Jr., Kalispell, MT (US); Rajesh Baskaran, Kalispell, MT (US); Nolan Zimmerman, Kalispell, MT (US); Zhongmin Hu, Kalispell, MT (US); Gregory J. Wilson, Kalispell, MT (US); Paul R. McHugh, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 365 days.

(21) Appl. No.: 10/295,302

(22) Filed: Nov. 15, 2002

(65) Prior Publication Data

US 2004/0013808 A1 Jan. 22, 2004

Related U.S. Application Data

(60) Provisional application No. 60/396,478, filed on Jul. 16, 2002.

(51) Int. Cl.
*B05C 3/00* (2006.01)
(52) U.S. Cl. ........................ 118/423; 118/429
(58) Field of Classification Search ............... 118/64, 118/66, 44, 72, 73, 600–63, 423, 429, 505, 118/503; 427/437, 443.1; 134/902; 96/64
See application file for complete search history.

(56) References Cited

U.S. PATENT DOCUMENTS

| | | | |
|---|---|---|---|
| 2,658,839 A * | 11/1953 | Talmey et al. | 427/438 |
| 2,791,516 A * | 5/1957 | Chambers et al. | 427/345 |
| 3,385,725 A | 5/1968 | Schmeckenbecher | |
| 4,594,273 A | 6/1986 | Doss et al. | |
| 4,655,162 A * | 4/1987 | Kameyama | 118/50 |
| 4,791,880 A | 12/1988 | Aigo | |
| 5,235,995 A * | 8/1993 | Bergman et al. | 134/105 |
| 5,741,362 A * | 4/1998 | Kobayashi | 118/603 |
| 5,938,845 A | 8/1999 | Ang | |
| 6,042,712 A | 3/2000 | Mathieu | |
| 6,294,059 B1 * | 9/2001 | Hongo et al. | 204/198 |

(Continued)

OTHER PUBLICATIONS

International Search Report for International Application No. PCT/US03/22174; Applicant: Semitool, Inc., 4 pgs. (Oct. 2003).

*Primary Examiner*—Brenda A. Lamb
(74) *Attorney, Agent, or Firm*—Perkins Coie LLP

(57) ABSTRACT

Apparatus and method for thermally controlled processing of microelectronic workpieces with liquids. An apparatus in accordance with and embodiment of the invention includes a process vessel configured to carry a processing liquid, such as an electroless processing liquid. The vessel has a thermally transmissive wall for transferring heat to and/or from the processing liquid within. A heat transfer device, such as a reservoir that receives processing liquid spilling over from the process vessel, transfers heat to or from the processing liquid within the process vessel. The heat transfer device can also transfer heat to or from an internal or external heat source, such as a conduit carrying a heat transfer fluid, or an electrical resistance heater. The interaction between the microelectronic workpiece and the processing liquid can be further controlled by controlling the rate at which the microelectronic workpiece rotates and/or the manner in which the microelectronic workpiece is introduced to and/or withdrawn from the processing liquid.

64 Claims, 13 Drawing Sheets

U.S. PATENT DOCUMENTS 6,551,412 B1 * 4/2003 Huang .................... 134/10
6,555,298 B1 * 4/2003 Rolfson .................. 430/330
6,716,330 B2 * 4/2004 Hongo et al. ............ 205/81

* cited by examiner

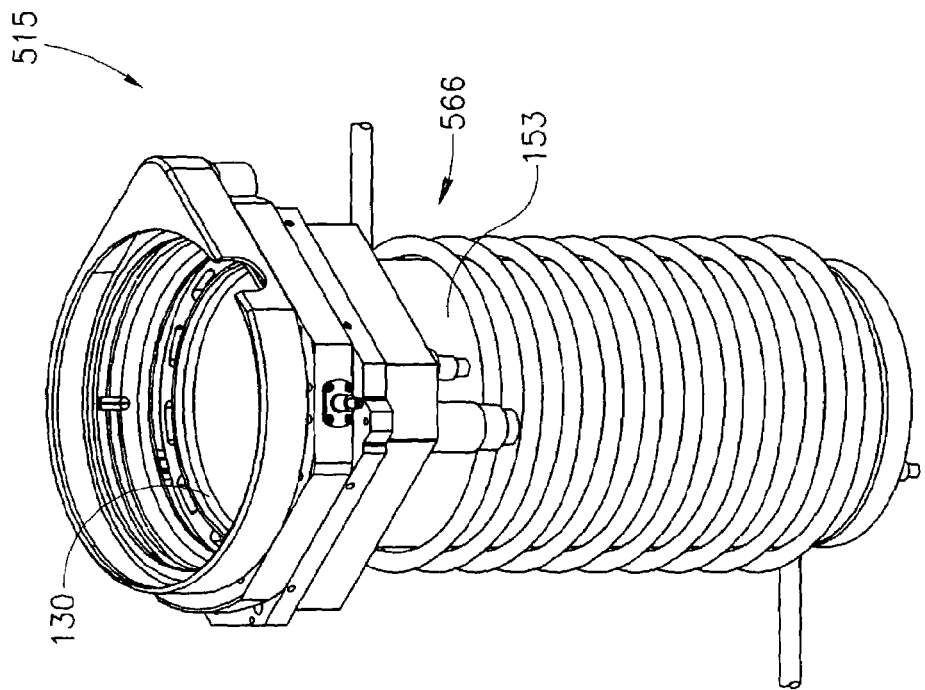
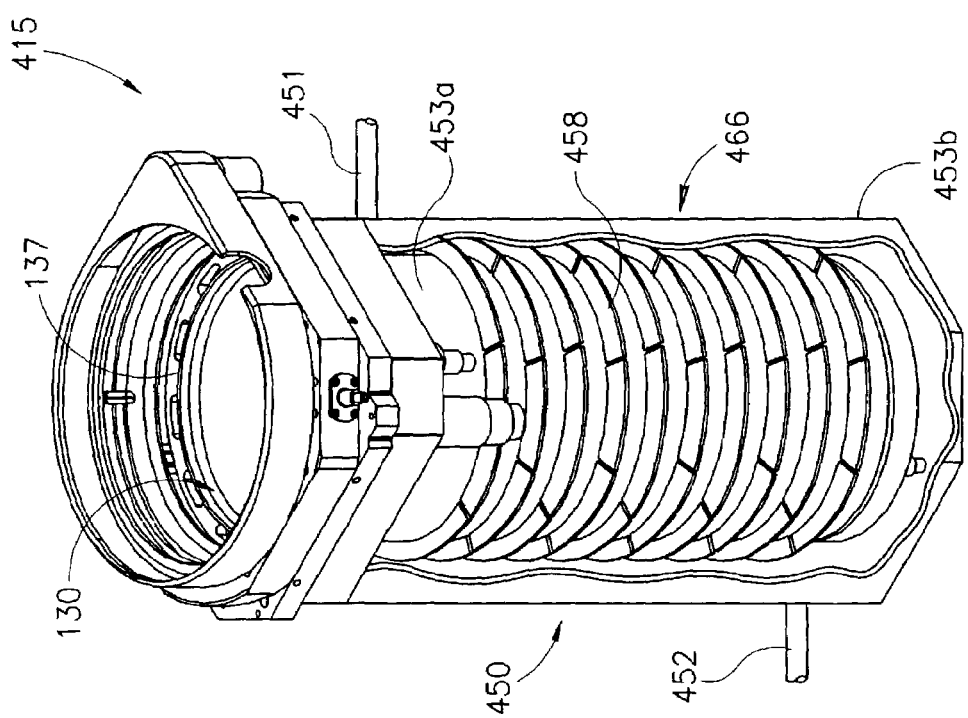

APPARATUS AND METHOD FOR THERMALLY CONTROLLED PROCESSING OF MICROELECTRONIC WORKPIECES

CROSS-REFERENCE TO RELATED APPLICATIONS

This application claims benefit of U.S. Provisional Patent Application No. 60/396,478, filed Jul. 16, 2002.

TECHNICAL FIELD

The present invention is directed generally to methods and apparatuses for thermally controlled processing of microelectronic workpieces, such as methods and apparatuses for controlling the temperature of an electroless deposition process.

BACKGROUND

Microelectronic devices, such as semiconductor devices and field emission displays, are generally fabricated on and/or in microelectronic workpieces using several different types of machines ("tools"). Many such processing machines have a single processing station that performs one or more procedures on the workpieces. Other processing machines have a plurality of processing stations that perform a series of different procedures on individual workpieces or batches of workpieces. In a typical fabrication process, one or more layers of conductive materials are formed on the workpieces during deposition stages. The workpieces are then typically subject to etching and/or polishing procedures (i.e., planarization) to remove a portion of the deposited conductive layers for forming electrically isolated contacts and/or conductive lines.

Plating tools that plate metals or other materials on the workpieces are becoming an increasingly useful type of processing machine. Electroplating and electroless plating techniques can be used to deposit nickel, copper, solder, permalloy, gold, silver, platinum and other metals onto workpieces for forming blanket layers or patterned layers. A typical metal plating process involves depositing a seed layer onto the surface of the workpiece using chemical vapor deposition (CVD), physical vapor deposition (PVD), or other suitable methods. After forming the seed layer, a blanket layer or pattern layer of metal may be deposited on the workpiece by an appropriate electroplating or electroless processing technique. In either process, the workpiece may then be cleaned, etched and/or annealed in subsequent procedures before transferring the workpiece to another processing machine.

In some conventional electroless processing techniques, the fluid used to plate conductive material onto the microelectronic workpiece is heated. For example, cobalt, nickel, and their alloys with tungsten are typically plated onto a microelectronic workpiece using a heated electroless solution. One drawback with heating the electroless solution is that it can be difficult to adequately control the processing temperature and flow uniformity at the interface between the microelectronic workpiece and the electroless processing liquid. This can adversely affect the chemical plating reaction occurring at the surface of the microelectronic workpiece and the uniformity with which multiple microelectronic workpieces are processed.

SUMMARY

The present invention is directed toward apparatuses and methods for controlling the temperature at which microelectronic workpieces are processed. One aspect of several embodiments of the invention includes controlling the temperature of a processing liquid (such as an electroless processing liquid) that contacts the microelectronic workpiece during processing. For example, in one particular aspect, a processing liquid is disposed in a process vessel for contact with a microelectronic workpiece. The process vessel has a thin and/or heat transmissive wall to allow heat to be readily transferred to or from the process vessel. A heat transfer device is positioned external to the process vessel to transfer heat to or from the process vessel through the heat transmissive wall. In a further aspect of the invention, the heat transfer device includes a second vessel positioned outwardly from the process vessel to receive processing liquid overflowing the process vessel. The second vessel carries the processing liquid in thermal communication with the heat transmissive wall of the process vessel. In yet a further aspect of the invention, a heat exchanger, such as an electrical resistance heater or a coil coupled to a source of heat transfer fluid, is disposed in the second vessel. Accordingly, the temperature within the process vessel can be precisely controlled to more effectively perform temperature sensitive processes.

In another aspect of the invention, the processing liquid passes into the process vessel through a diffuser having a primary exit opening and at least one secondary exit opening. The primary exit opening is larger than the at least one secondary exit opening so that, for example, about 20 percent to about 50 percent of the total flow passing through the diffuser passes through the primary exit opening.

Methods in accordance with other aspects of the invention are directed to controlling other characteristics of the interaction between the processing liquid and the microelectronic workpiece. In one aspect of the invention, the distribution of material added to the microelectronic workpiece during processing is controlled by controlling a rate at which the microelectronic workpiece rotates while contacting the processing liquid. In another aspect of the invention, a temperature distribution at the face of the microelectronic workpiece is controlled during processing by controlling the rate at which the microelectronic workpiece rotates.

In a method in accordance with still another aspect of the invention, heat is transferred between the microelectronic workpiece and the processing liquid before and/or after processing. For example, when the processing liquid is heated, the microelectronic workpiece is positioned proximate to and spaced apart from the processing liquid (prior to contacting the processing liquid) to pre-heat the microelectronic workpiece. The rate at which the microelectronic workpiece is cooled after processing is controlled by positioning the microelectronic workpiece proximate to and spaced apart from the processing liquid after processing has been completed.

BRIEF DESCRIPTION OF THE DRAWINGS

FIG. 4 is a partially schematic, partially broken isometric view of a processing station having a heat transfer device in accordance with another embodiment of the invention.

FIG. 5 is a partially schematic, isometric view of a processing station having a heat transfer device in accordance with still another embodiment of the invention.

DETAILED DESCRIPTION

The following description discloses the details and features of several embodiments of processing stations, integrated tools and associated methods for processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. Features in the substrate can include submicron features (having submicron dimensions ranging from, for example, 0.1µ to 0.75µ) such as trenches, vias, lines and holes. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1-14C.

Many aspects of the invention described below may be combined in further embodiments of the invention. For purposes of discussion, however, several of these aspects are described in separate sections below with reference to certain figures. For example, Section A (FIG. 1) describes a tool that carries one or more processing vessels in accordance with embodiments of the invention, Section B (FIGS. 2-9) describes processing vessels having heat transfer features in accordance with further embodiments of the invention, and Section C (FIGS. 10 and 11) describes flow diffusers in accordance with further embodiments of the invention. Section D (FIGS. 12 and 13) describes processes for controlling microelectronic workpiece temperatures before and/or after processing in accordance with still further embodiments of the invention, and Section E (FIGS. 14A-14C) describes processes for controlling the temperature of, and deposition rate of, material onto the microelectronic workpieces by controlling the rotation speed of the microelectronic workpieces.

A. Microelectronic Workpiece Processing Tools

Figure 1:
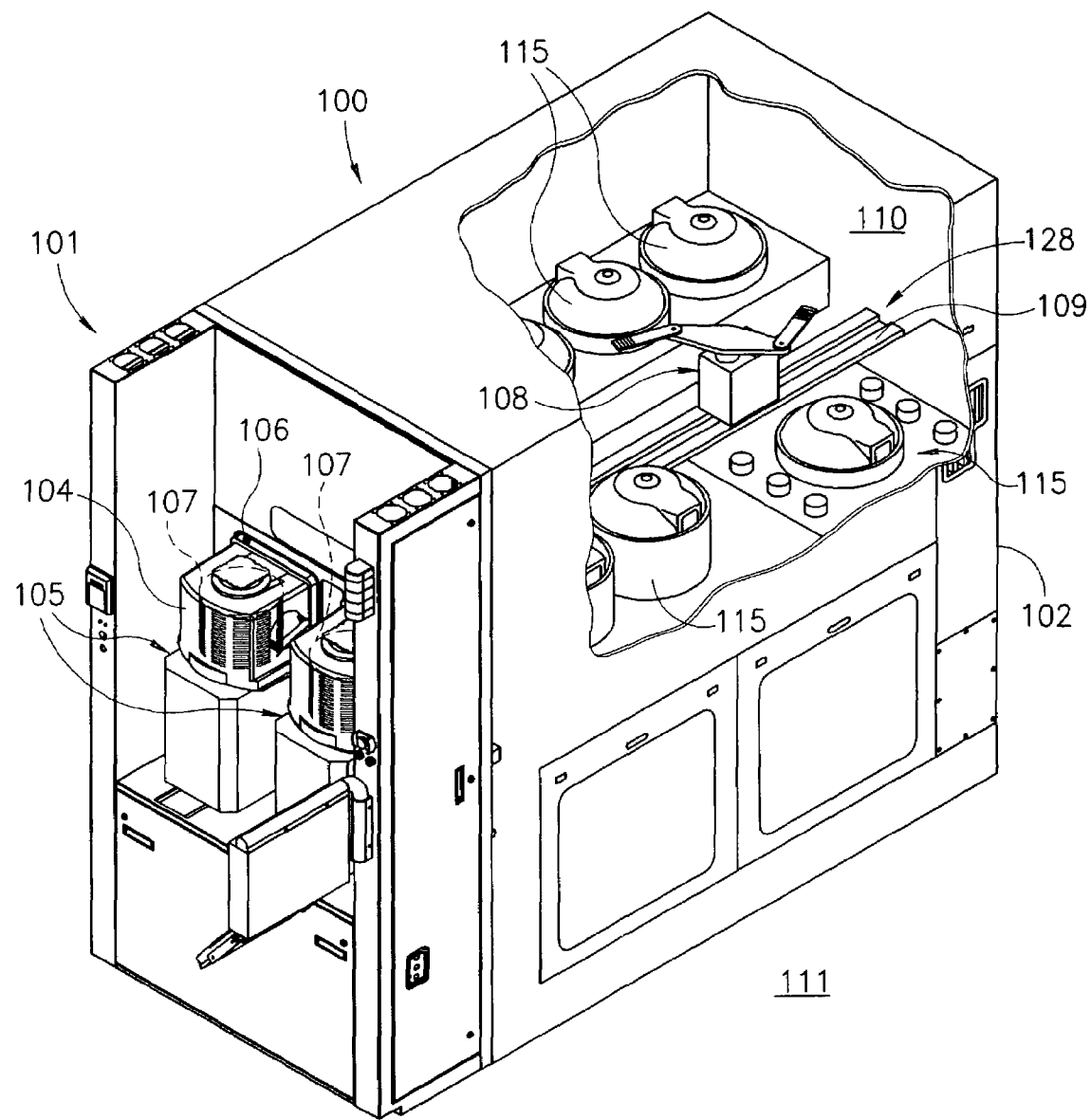
FIG. 1 is a partially cutaway, partially schematic isometric view of an apparatus having one or more processing stations in accordance with an embodiment of the invention.

FIG. 1 is an isometric view of a processing machine or tool 100 having one or more processing stations 115 in accordance with embodiments of the invention. A portion of the processing tool 100 is shown in cut-away view to illustrate selected internal components. In one aspect of this embodiment, the processing tool 100 includes a cabinet 102 or other enclosure that at least partially isolates an interior region 110 from an exterior region 111. The cabinet 102 includes a plurality of apertures 106 (one of which is visible in FIG. 1) through which microelectronic workpieces move between the interior region 110 and the exterior region 111 via an input/output station 101. In one embodiment, the input/output station 101 has two container supports 105, each configured to position a workpiece container 104 proximate to the apertures 106. In other embodiments, the input/output station 101 supports more or fewer workpiece containers 104. In any of these embodiments, the workpiece containers 104 each house a plurality of microelectronic workpieces 107 in a "mini" clean environment suitable for carrying a plurality of workpieces 107 through other environments that are not at clean room standards. Each of the workpiece containers 104 is accessible from the interior region 110 of the cabinet 102 through the apertures 106 for delivery to the processing stations 115.

The processing stations 115 include clean/etch capsules, annealing stations, metrology stations, electroless deposition stations, electrolytic deposition stations, and/or other stations configured to perform these or other processes on the microelectronic workpieces 107. A transfer device 128 moves the microelectronic workpieces 107 between the input/output station 101 and the processing stations 115. In one embodiment, the transfer device 128 includes a linear track 109 extending in a lengthwise direction of the interior region 110 between facing rows of the processing stations 115. A robot unit 108 moves along the track 109 to access any of the processing stations 115 within the cabinet 102. The operation of the tool 100 is controlled by a controller 112 that can receive instructions from an operator and, based on the instructions, autonomously or semi-autonomously direct the operation of the tool. Accordingly, some or all of the methods and operations described below can be directed by computer-based programs or codes.

Figure 2:
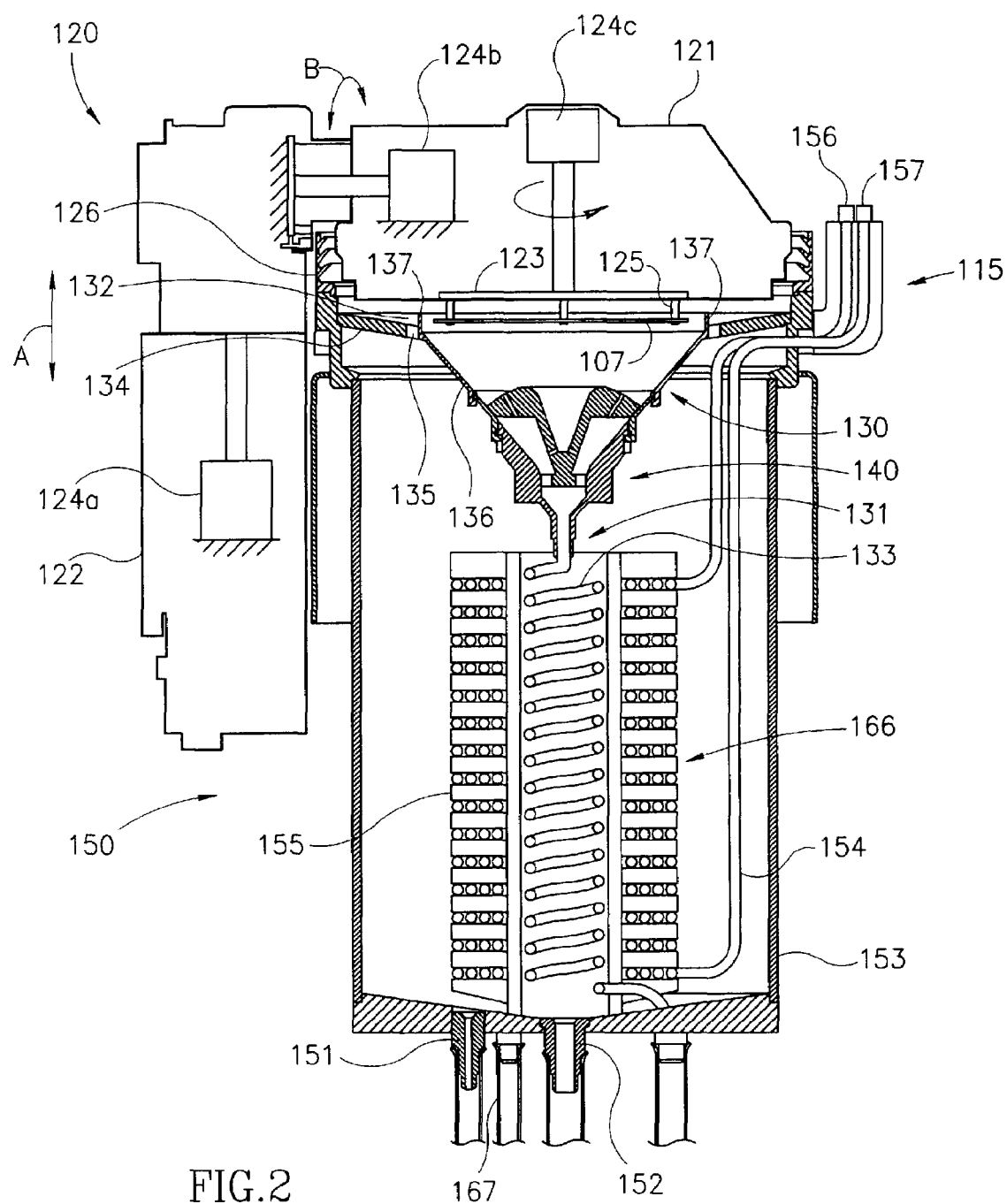
FIG. 2 is a partially schematic, cross-sectional elevation view of a processing station in accordance with an embodiment of the invention.

FIG. 2 is a partially schematic, cross-sectional view of one of the process stations 115 configured in accordance with an embodiment of the invention. In one aspect of this embodiment, the process station 115 includes a support member 120 that supports a microelectronic workpiece 107 relative to a process vessel 130. Processing liquid in the process vessel 130 is temperature controlled by a heat transfer device 150 and/or other features of the process station 115. In one embodiment, the temperature of the processing liquid is elevated above ambient, for example, during electroless metal deposition processes. The processing liquid can accordingly include any of a wide variety of electroless processing liquids typically used to apply conductive materials for barrier layers, feature filling and/or blanket layers. In another embodiment, the temperature of the processing liquid is reduced below ambient, or reduced from an initially high temperature above ambient to a lower temperature above ambient. Accordingly, the heat transfer device 150 transfers heat to and/or from the processing liquid depending upon the process requirements. In any of these embodiments, the support member 120 carries the microelectronic workpiece 107 in contact with the processing liquid during processing.

In one aspect of this embodiment, the microelectronic workpiece 107 is carried by a head 121, which is in turn carried by a head support 122. The head support 122 includes an elevator motor 124a that moves the head 121 upwardly and downwardly (as indicated by arrow A) relative to the process vessel 130. A head rotation motor 124b located in the head 121 rotates a shaft that is fixedly attached to the head support 122. As the head rotation motor 124b turns, the head 121 rotates relative to the head support 122 (as indicated by arrow B) to move the microelectronic workpiece 107 between a face-up orientation (for loading and unloading) and a face-down orientation (for processing). The head 121 further includes a workpiece rotation motor 124c coupled to a carrier 123. The workpiece rotation motor 124c rotates the carrier 123, as indicated by arrow C.

In one embodiment, the carrier 123 includes a plurality of posts 125 or other retention devices or contact portions that contact the microelectronic workpiece 107 to support the microelectronic workpiece 107 in a face-down orientation. In one aspect of this embodiment, the posts 125 contact only the outermost peripheral edge of the microelectronic workpiece 107. In another aspect of this embodiment, the posts 125 support the microelectronic workpiece at a plurality of spaced-apart locations. For example, in one particular embodiment, the support posts 125 contact the microelectronic workpiece 107 at six locations, and in another embodiment, the support posts 125 contact the microelectronic workpiece 107 at seven locations. In still further embodiments, the support posts 125 contact the microelectronic workpiece 107 at more or fewer locations. In yet a further aspect of these embodiments, the support posts 125 carry the microelectronic workpiece 107 so that at least a portion (such as the central portion) of the backside of the workpiece 107 is spaced apart from the carrier 123 and any other backside structures, such as a backplate. Accordingly, the amount of heat transferred through the backside of the microelectronic workpiece 107 can be reduced from existing arrangements.

In any of the foregoing embodiments, the head 121 supports the microelectronic workpiece 107 with at least the front side in contact with the processing liquid in the process vessel 130, while the workpiece rotation motor 124c spins the microelectronic workpiece 107. After processing is completed, the elevator motor 124a lifts the head 121 and an optional rinse device 126 rinses the workpiece 107. The head rotation motor 124b then inverts the head 121, allowing the transfer device 128 (FIG. 1) to retrieve the microelectronic workpiece 107 and position the next microelectronic workpiece 107 for processing in the process vessel 130.

In one aspect of this embodiment, the process vessel 130 includes a supply conduit 133 that delivers the processing liquid to an entrance portion 131 positioned toward the lower portion of the process vessel 130. The processing liquid proceeds through a diffuser 140 (described in greater detail below with reference to FIGS. 10 and 11) to contact the microelectronic workpiece 107. The processing liquid exits the process chamber 130 at an exit portion 132. In one embodiment, the exit portion 132 includes a weir 137 that establishes the level of the free surface of the processing liquid. The processing liquid proceeds over the weir 137 and is received on an outwardly extending skirt 134. The skirt 134 includes overflow apertures 135 through which the processing liquid descends after having contacted the microelectronic workpiece 107.

In a further aspect of this embodiment, the heat transfer device 150 is disposed in thermal contact with the process vessel 130 to control the temperature of the processing liquid in the process vessel 130. In a specific aspect of this embodiment, the heat transfer device 150 includes a heat transfer vessel or reservoir 153 having an upper entrance portion that collects the processing liquid proceeding over the weir 137 of the process vessel 130. The processing liquid received from the process vessel 130 mixes with additional processing liquid introduced to the heat transfer vessel 153 through another entrance portion 151. In one embodiment, the additional processing liquid entering through the entrance portion 151 is temperature controlled by an additional heat transfer device positioned remote from the heat transfer vessel 153, as described in greater detail below with reference to FIG. 7. In another embodiment, heat is transferred to or from the processing liquid, including the additional processing liquid, while the processing liquid is in the heat transfer vessel 153, as described below, either in addition to or in lieu of transferring heat to or from the additional processing liquid remotely. In a further aspect of at least some of these embodiments, the processing liquid is removed from the heat transfer vessel 153 through an exit portion 152 and recycled, as is also described in greater detail below with reference to FIG. 7. A sensor port 167 is coupled to a sensor (not shown in FIG. 2) to determine the liquid level in the heat transfer vessel 153.

In one embodiment, the heat transfer vessel 153 includes a heat exchanger 166 that transfers heat directly to or from the processing liquid within the heat transfer vessel 153. In one aspect of this embodiment, the heat exchanger 166 includes one or more heat exchanger conduits 154 through which a heat transfer fluid passes. In another aspect of this embodiment, the heat transfer fluid includes deionized water (suitable for temperatures between 0° C. and 100° C.) or other fluids, such as ethylene glycol, glycerol, fluorinated compounds, or oils (suitable for higher or lower temperatures). Deionized water is suitable for typical electroless plating processes, which are conducted at temperatures of from about 40° C. to about 80° C. In any of these embodiments, the heat exchanger conduit 154 enters the heat transfer vessel 153 at a heat exchanger input port 156, and exits at a heat exchanger output port 157.

In a further aspect of this embodiment, the heat exchanger conduit 154 is supported on a heat exchanger support 155 in close proximity to the supply conduit 133 to improve the efficiency with which heat is transferred between the heat exchanger conduit 154 and the processing liquid in the supply conduit 133. In yet a further aspect of this embodiment, the heat exchanger conduit 154 has a spiral or other convoluted path surrounding the supply conduit 133, and the supply conduit 133 also has a spiral or other convoluted path as it passes through the heat transfer vessel 153 to the process vessel 130. In other embodiments, the heat exchanger conduit 154 and/or the supply conduit 133 can have other arrangements that increase the surface area available for heat transfer. For example, in one embodiment, the heat exchanger conduit 154 and/or the supply conduit 133 include heat transfer fins. In other embodiments, the processing liquid within the heat transfer vessel 153 is heated or cooled in accordance with other arrangements. For example, in one particular embodiment, the heat exchanger 166 includes an electrical resistance heater (coated and/or otherwise protected from contact with the processing liquid) in place of the heat exchanger conduit 154. In still further embodiments, heat is transferred to or from the heat transfer vessel 153 by external devices rather than internal devices, as described in greater detail below with reference to FIGS. 4 and 5. An advantage of a simple, fluid-containing supply conduit 133 without heat transfer fins is that is less likely to have locally high (or low) temperature regions. Such regions can cause conductive materials in the processing liquid to plate out.

In any of the foregoing embodiments, the heat exchanger conduit 154 transfers heat not only to or from the processing liquid within the supply conduit 133, but also to or from the processing liquid outside the supply conduit 133 and within the heat transfer vessel 153. The processing liquid in the heat transfer vessel 153 in turn transfers heat to or from the processing liquid within the process vessel 130 through a vessel wall 136 of the process vessel 130. Accordingly, in one aspect of this embodiment, the vessel wall 136 is thin and/or highly thermally conductive or otherwise thermally transmissive to improve the efficiency with which heat is transferred to or from the processing liquid within.

Figure 3:
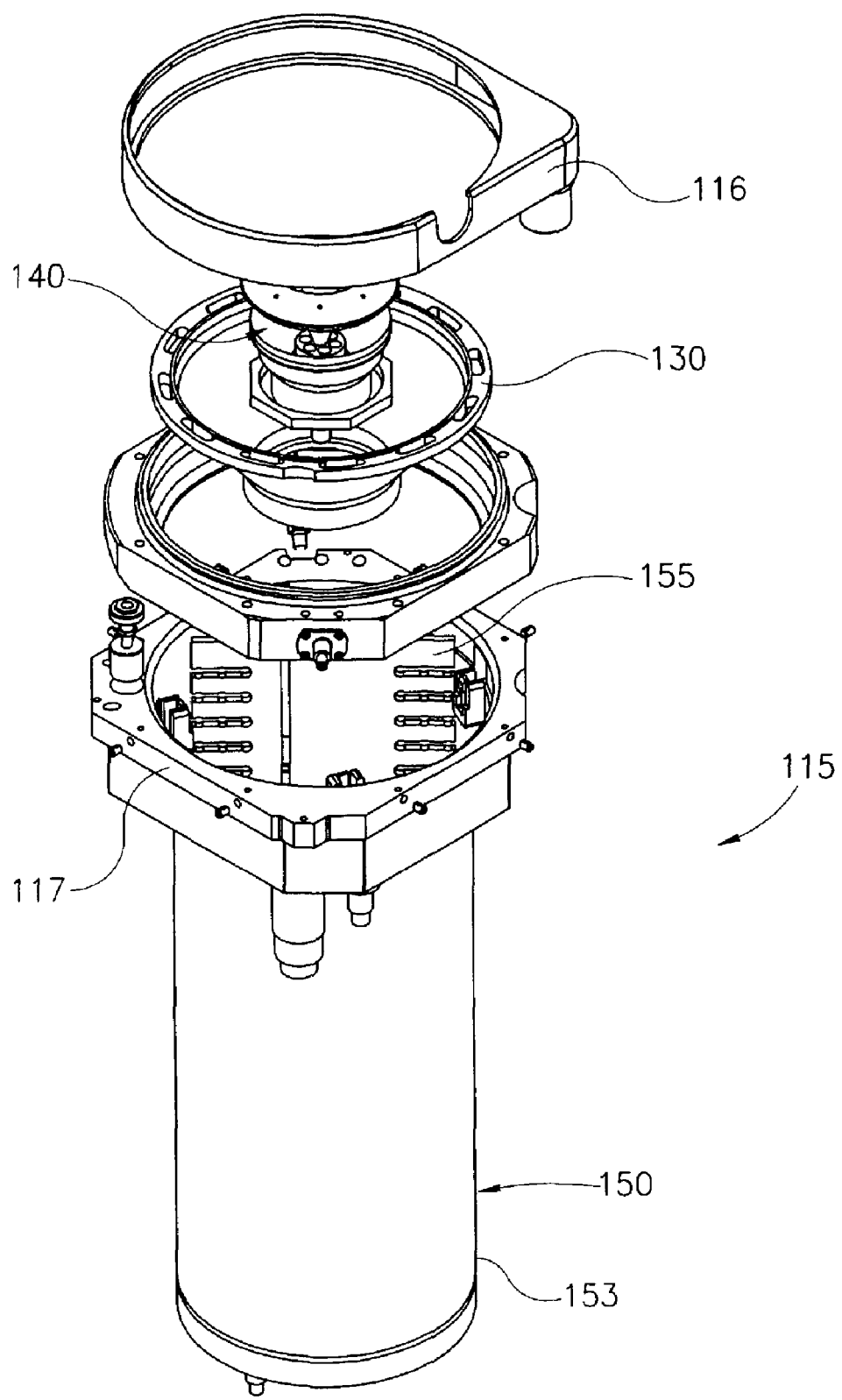
FIG. 3 is a partially exploded, top isometric view of a portion of a processing station generally similar to that shown in FIG. 2.

FIG. 3 is a partially exploded, top isometric view of a process station 115 generally similar to that described above with reference to FIG. 2. In one aspect of this embodiment, the process station 115 includes a mounting plate 117 for attaching the process station 115 to the tool 100 (FIG. 1). The process station 115 further includes an exhaust plenum 116 that carries away gas bubbles that may be present in the process vessel 130. Such bubbles can interfere with the processes completed on the microelectronic workpiece 107 (FIG. 2).

In one aspect of an embodiment shown in FIG. 3, the exhaust plenum 116, the process vessel 130 and the diffuser 140 are configured to be easily removed from the process station 115. Accordingly, the heat exchanger support 155 and the heat exchanger conduit 154 (FIG. 2) it supports can easily be removed from the heat transfer vessel 153 for cleaning and/or other routine servicing and/or maintenance.

FIG. 4 is a partially schematic, partially broken isometric view of a process station 415 having a heat transfer device 450 and a heat exchanger 466 in accordance with another embodiment of the invention. In one aspect of this embodiment, the process station 415 includes a process vessel 130 generally similar to that described above with reference to FIG. 2. The heat transfer device 450 includes a first heat transfer vessel 453a disposed outwardly from the process vessel 130 to transfer heat to or from the processing liquid in the process vessel 130 and to collect processing liquid that overflows the weir 137 of the process vessel 130. The heat exchanger 466 (which heats or cools the processing liquid in the first heat transfer vessel 453a) includes a second heat transfer vessel 453b disposed outwardly from the first heat transfer vessel 453a. The second heat transfer vessel 453b includes an entrance portion 451 that receives a heat transfer fluid separately from and/or different from the processing liquid. The heat transfer fluid proceeds through the second heat transfer vessel 453b to an exit portion 452 and, as it does so, transfers heat to the processing liquid in the first heat transfer vessel 453a. The process station 415 can optionally include baffles or fins 458 in the interstitial region between the first heat transfer vessel 453a and the second heat transfer vessel 453b to control the flow of the heat transfer fluid through the second heat transfer vessel 453b and/or to increase the amount of heat transferred between the heat transfer fluid and the first heat transfer vessel 453a.

FIG. 5 is a partially schematic illustration of a process station 515 configured in accordance with another embodiment of the invention. In one aspect of this embodiment, the process station 515 includes a process vessel 130 and a heat transfer vessel 153 configured generally similarly to the process vessel 130 and heat transfer vessel 153 described above with reference to FIG. 2. A heat exchanger 566 is positioned outwardly from the heat transfer vessel 153 to heat or cool the processing liquid within the heat transfer vessel 153. In one aspect of this embodiment, the heat exchanger 566 includes a conduit that carries a heat transfer fluid in thermal contact with the heat transfer vessel 453. In another embodiment, the heat exchanger 566 includes an electrical resistance heater, also disposed in thermal contact with the heat transfer vessel 153.

Figure 6:
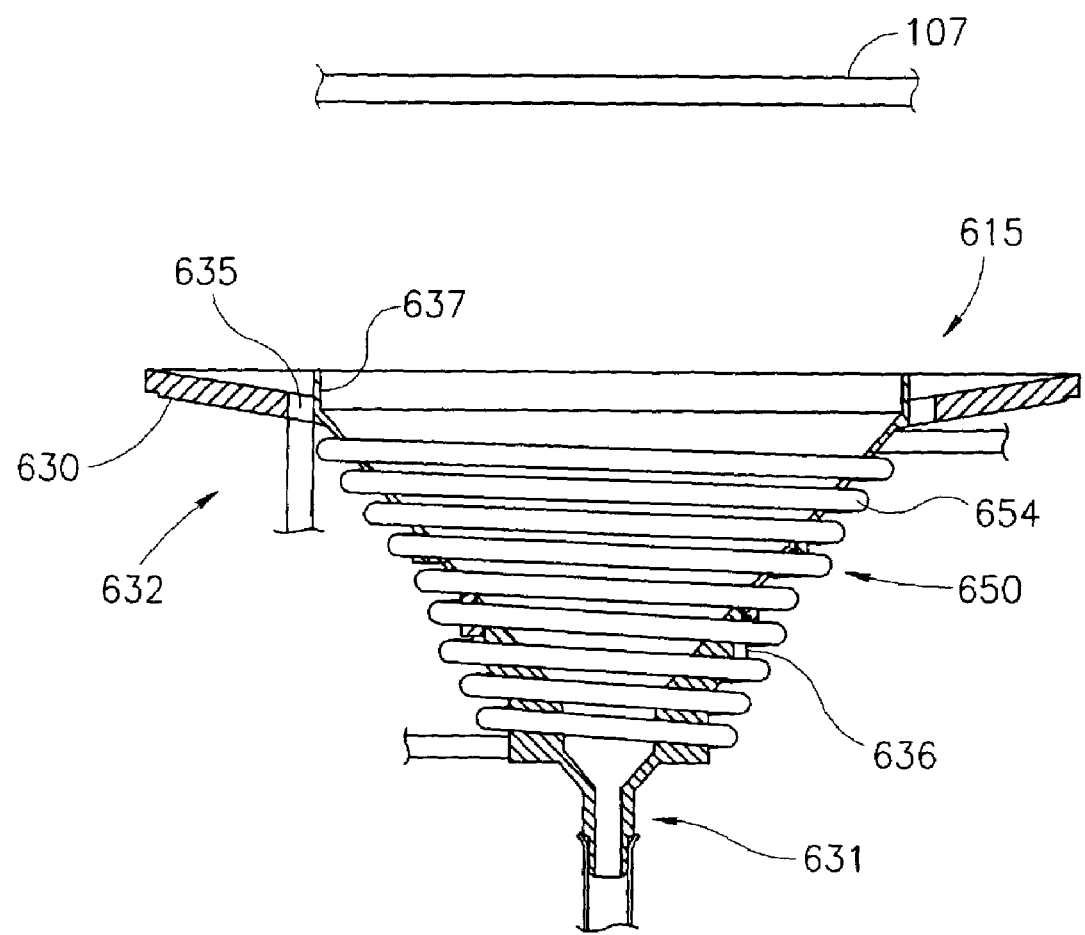
FIG. 6 is a cross-sectional elevation view of a portion of a processing vessel having a heat transfer device in accordance with yet another embodiment of the invention.

FIG. 6 is a partially schematic, partial cross-sectional side elevation view of a portion of process station 615 configured in accordance with another embodiment of the invention. In one aspect of this embodiment, the process station 615 includes a process vessel 630 having an entrance portion 631 that receives the processing liquid, and an exit portion 632 through which the processing liquid exits the process vessel 630. The exit portion 632 includes a weir 637 over which the processing liquid proceeds in a manner generally similar to that described above with reference to FIG. 2. An overflow aperture 635 receives the processing liquid proceeding over the weir 637. The processing liquid removed from the process vessel 630 is then recycled or disposed of.

An embodiment of the process station 615 further includes a heat transfer device 650 disposed outwardly from and adjacent to a conical vessel wall 636 of the process vessel 630. In one aspect of this embodiment, the heat transfer device 650 includes a conduit 654 that conveys a heat transfer fluid in a spiral path around the vessel wall 636. In another embodiment, the heat transfer device 650 includes an electrical resistance heater disposed in a generally similar fashion to heat the processing liquid within the process vessel 630. In other embodiments the heat transfer device 650 includes other arrangements positioned to transfer heat through the vessel wall 636 to or from the processing liquid within.

In another aspect of this embodiment, the process vessel 630 has a relatively small volume to reduce the likelihood for heat loss from the processing liquid therein. For example, in one embodiment, the process vessel 630 is sized to receive a 200 mm (20 cm) diameter microelectronic workpiece 107, and has a volume of 100 cm$^3$ or less. In a particular embodiment, the process vessel 630 has a volume of about 20 cm$^3$. In another particular embodiment, the process vessel 630 has a volume of about 32 cm$^3$ (sufficient to provide a 1 mm thick fluid layer on a 200 mm diameter workpiece 107). Accordingly, a ratio of the cube of the workpiece diameter to the volume of the process vessel 630 has a range of from about 80 (for a 100 cm$^3$ volume) to about 400 (for a 20 cm$^3$ volume) in one embodiment. In other embodiments, the vessel 630 has other volumes depending, for example, on the target level of metal depletion for the processing liquid. For example, when depositing a 100 Å layer of a cobalt-tungsten-phosphorous alloy on a single 200 mm workpiece, with a processing liquid having a relatively low metal ion concentration, the metal in the processing liquid will be completely depleted if the process volume is 2.3 cm$^3$, 10% depleted if the process volume is 22 cm$^3$, and 5% depleted if the process volume is 44 cm$^3$.

In one embodiment, a process vessel 630 having a relatively small volume is suitable for single-use processing with an electroless or other processing liquid. A method in accordance with one aspect of this embodiment includes directing a first quantity of the processing liquid into the process vessel 630, lowering the microelectronic workpiece 107 into contact with the processing liquid for processing, and removing the microelectronic workpiece 107 from the processing liquid. The first quantity of the processing liquid is then removed from the process vessel 630 and replaced with a fresh, second quantity of the processing liquid before processing the next microelectronic workpiece 107. The foregoing method is particularly suitable for electrolessly depositing metals onto the microelectronic workpiece 107, and is also suitable for other processes, such as those for which a characteristic (such as the chemistry) of the processing liquid is unstable.

Figure 7:
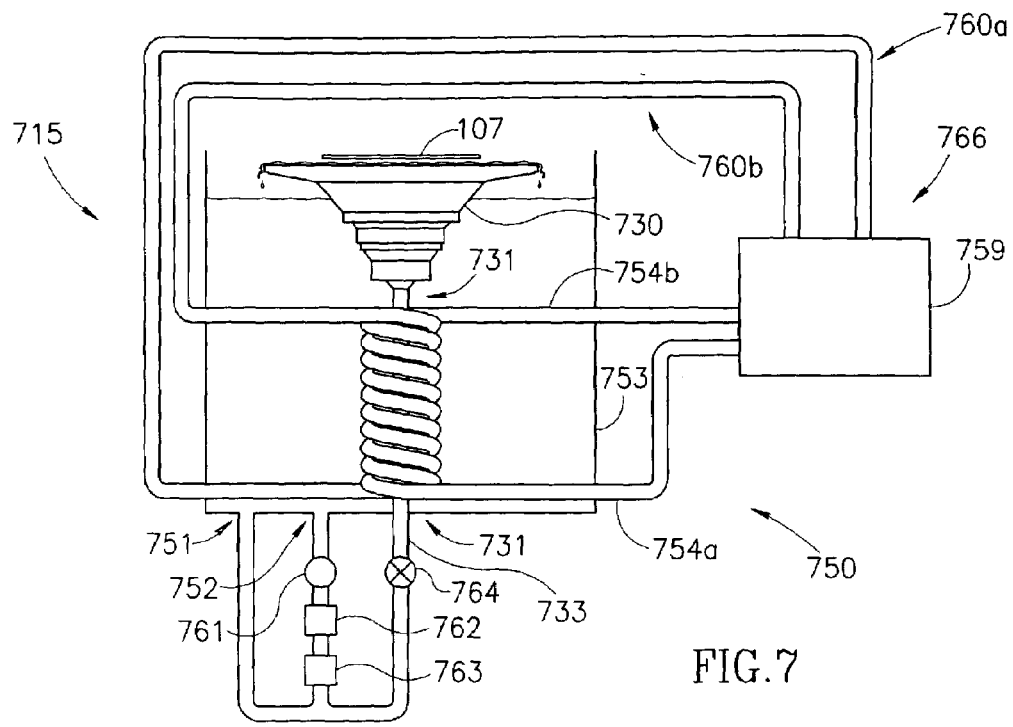
FIG. 7 is a schematic illustration of a processing station having a flow passage and valve arrangement in accordance with an embodiment of the invention.

FIG. 7 is a schematic illustration of a process station 715 having an arrangement of heat transfer features and flow features in accordance with another embodiment of the invention. In one aspect of this embodiment, the process station 715 includes a process vessel 730 positioned to overflow the processing liquid into a heat transfer vessel 753 in a manner generally similar to that described above with reference to FIG. 2. The process vessel 730 is supplied with the processing liquid by a supply conduit 733 which is shown as a straight conduit in FIG. 7 for purposes of illustration, but can have a convoluted or spiral shape generally similar to the supply conduit 133 described above with reference to FIG. 2.

In one aspect of this embodiment, the process station 715 includes a heat transfer device 750 to heat or cool the processing liquid in the supply conduit 733 and in the process vessel 730. The heat transfer device 750 includes the heat transfer vessel 753 and a heat exchanger 766. The heat exchanger 766 includes a heater 759 positioned external to the heat transfer vessel 753 to heat or cool a heat transfer fluid passing through two circuits 760 (shown in FIG. 7 as a first circuit 760*a* and a second circuit 760*b*). Each circuit 760 includes a heat exchanger conduit 754 (shown as a first heat exchanger conduit 754*a* and a second heat exchanger conduit 754*b*). The first and second circuits 760*a*, 760*b* have a counterflow heat exchanger arrangement. Accordingly, the first heat exchanger conduit 754*a* enters the heat transfer vessel 753 toward the bottom and exits the heat transfer vessel 753 toward the top. The second heat exchanger conduit 754*b* enters the heat transfer vessel 753 toward the top and exits the heat transfer vessel 753 toward the bottom. As a result, the contents of both the heat transfer vessel 753 and the supply conduit 733 are uniformly heated or cooled. In other embodiments, the heat transfer device 750 includes more or fewer than two circuits, depending upon specific requirements, such as the processing liquid flow rates and permissible temperature deviations.

In another aspect of this embodiment, the processing liquid in the heat transfer vessel 753 is removed from the heat transfer vessel 753 at an exit portion 752. The processing liquid proceeds through a pump 761, a filter 762, and, optionally, an in-line heat exchanger 763. The processing liquid is then provided to both an entrance portion 731 of the process vessel 730, and an entrance portion 751 of the heat transfer vessel 753. A valve or restrictor 764 regulates the rate at which the processing liquid proceeds through the entrance portion 731 of the process vessel 730. When the pump 761 operates at a constant rate, reducing the flow rate through the valve 764 increases the flow rate through the entrance portion 751 of the heat transfer vessel 753, and increasing the flow rate through the valve 764 has the opposite effect. In another alternate arrangement, separate valves independently control the flow to the process vessel 730 and the heat transfer vessel 753. In either embodiment, the flow rates to the process vessel 730 and/or the heat transfer vessel 753 are selected to produce the desired rate of flow at the microelectronic workpiece 107 with the desired temperature uniformity.

In some cases, the desired flow rate of processing liquid into the process vessel 730 is so low that the rate at which heat is lost from the processing liquid free surface exceeds the rate at which heat is added by the heat transfer device 750 and the in-line heat exchanger 763. In these cases, a method in accordance with an embodiment of the invention includes processing one or more microelectronic workpieces 107 at very low processing liquid flow rates while allowing a relatively small, acceptable change in the temperature of the processing liquid in the process vessel. The processing vessel 730 is then flushed with a high flow rate of the processing liquid to introduce fresh processing liquid at the desired processing temperature before the next microelectronic workpiece 107 is processed.

Figure 8:
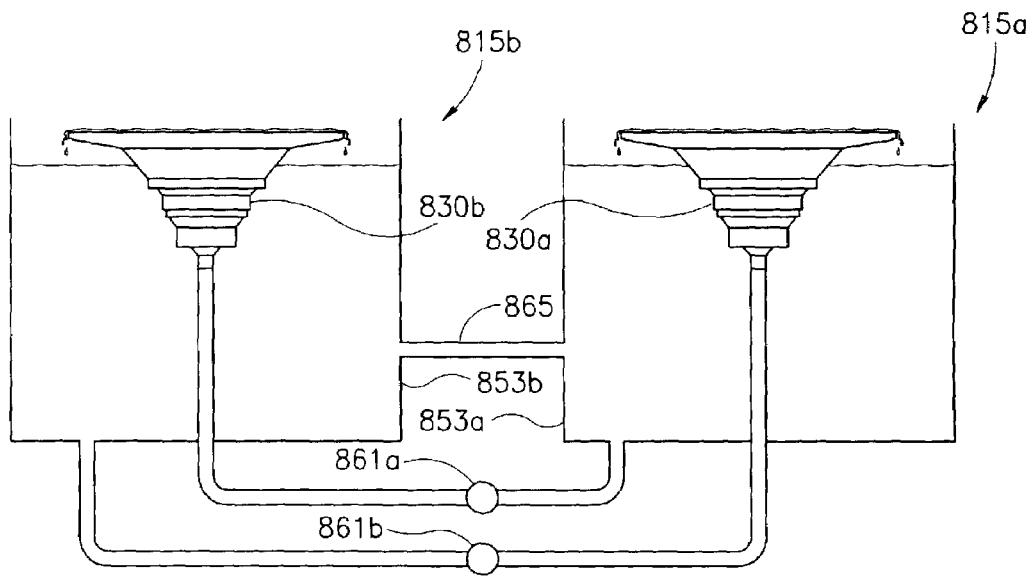
FIG. 8 is a schematic illustration of a pair of processing stations coupled in accordance with an embodiment of the invention.

FIG. 8 is a schematic illustration of a pair of process stations 815 (shown as a first process station 815*a* and a second process station 815*b*), each having a process vessel 830 (shown as a first process vessel 830*a* and a second process vessel 830*b*) generally similar to the process vessel 130 described above with reference to FIG. 2. Processing liquid proceeds from the process vessels 830*a*, 830*b* into corresponding heat transfer vessels 853*a*, 853*b*. A first pump 861*a* directs processing liquid from the first heat transfer vessel 853*a* into the second process vessel 830*b*, and a second pump 861*b* directs processing liquid from the second heat transfer vessel 853*b* to the first process vessel 830*a*. An equalization channel 865 is coupled between the heat transfer vessels 853*a*, 853*b* to maintain a constant level of processing liquid in each heat transfer vessel 853*a*, 853*b*. One feature of this arrangement is that the temperature of the processing liquid in each of the process vessels 830*a*, 830*b* can be approximately the same by cross-coupling the process vessels 830 and the heat transfer vessels 853. An advantage of this features is that the microelectronic workpieces processed in each vessel 830*a*, 830*b* will be subject to approximately the same process conditions, resulting in greater uniformity of the processed microelectronic workpieces.

Figure 9:
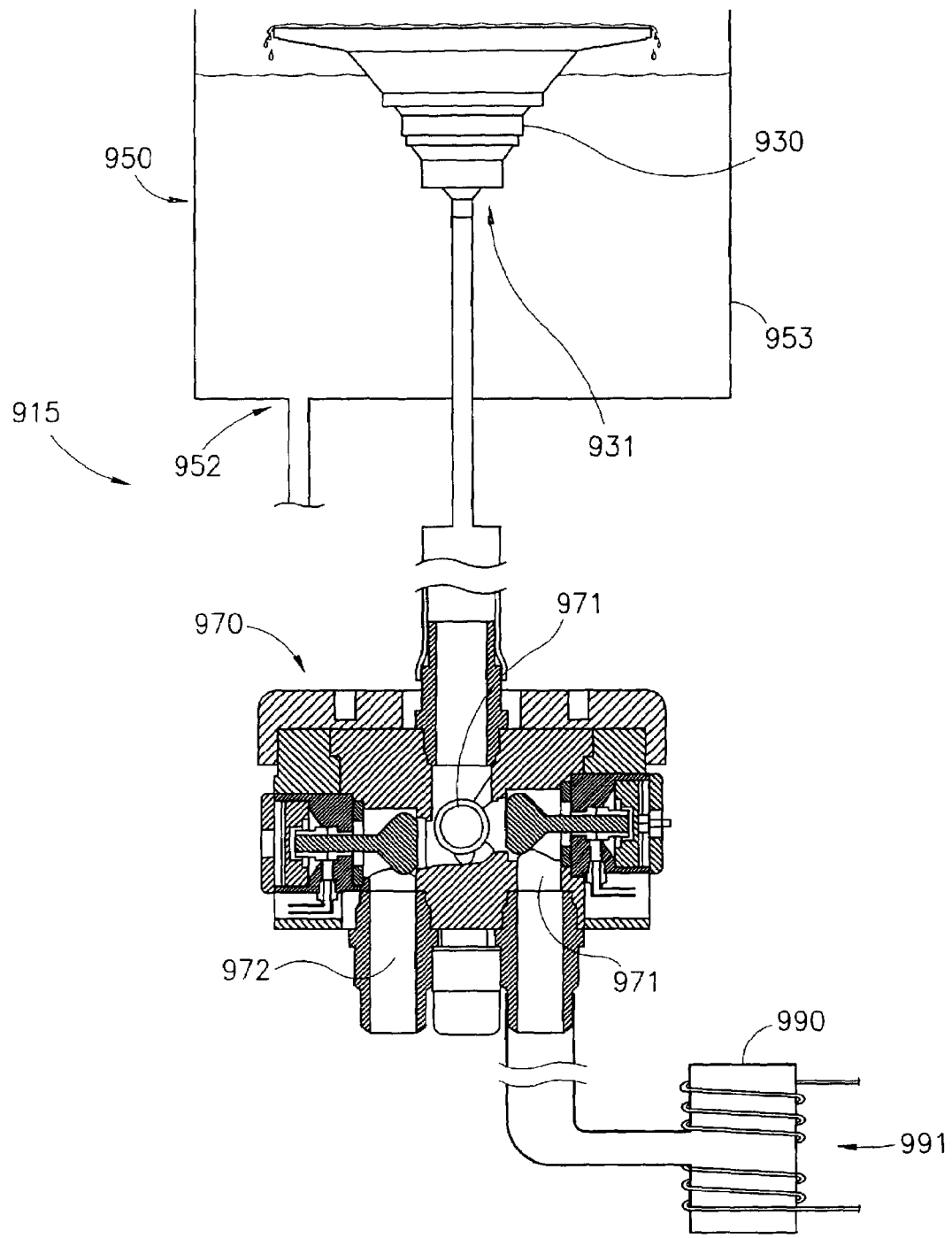
FIG. 9 is a partially schematic, partial cross-sectional view of a process station having a valve arrangement in accordance with an embodiment of the invention.

FIG. 9 is a schematic illustration of a process station 915 having a process vessel 930 that receives a plurality of processing liquids from a supply valve assembly 970 in accordance with another embodiment of the invention. In one aspect of this embodiment, the process vessel 930 includes an entrance portion 931 coupled to the supply valve assembly 970 to receive the processing liquids. A heat transfer device 950 (such as a heat transfer vessel 953) transfers heat to or from the process vessel 930 in a manner generally similar to that described above. The supply valve assembly 970 includes a single housing that supports three supply valves 971 (two of which are visible in FIG. 9) to sequentially supply three different processing liquids to the process vessel 930 during sequential phases of the operation. A source 990 for one of the processing liquids is shown schematically in FIG. 9, and includes a heat transfer device 991 (such as a heat transfer fluid conduit) to heat or cool the processing liquid. A drain valve 972 is positioned beneath the supply valves 971 to more completely drain the supply valve assembly 970. The heat transfer vessel 953 includes an exit portion 952 that, in one embodiment, is coupled to a valve assembly having a configuration generally similar to that of the supply valve 970 to segregate the processing liquids exiting the heat transfer vessel 953.

In one aspect of this embodiment, the single housing sequentially provides multiple processing liquids to a single process vessel 930. In another embodiment, a plurality of housings, each having a separate valve, are coupled together to supply a corresponding plurality of processing liquids. In either of these embodiments, the single process vessel 930 is supplied with a plurality of processing liquids to carry out a corresponding plurality of chemical processes. Accordingly, the single process vessel 930 can be used to perform operations such as material deposition material removal, cleaning and/or other processes on the microelectronic workpiece. The multi-port supply valve assembly 970 is also suitable for selectively coupling the process vessel 930 to a source of cleaning liquid. Accordingly, the process vessel 930 may be cleaned (for example, by removing deposits of chemicals that plate out of or otherwise precipitate from the processing liquid) without disassembling the process vessel 930. In other embodiments, for example, when high throughput requirements require a variety of microelectronic workpieces to be processed simultaneously, the tool 100 (FIG. 1) includes a plurality of process vessels, each coupled to a separate source of processing liquid.

One feature of certain embodiments of the process stations described above with reference to FIGS. 1-9 is that the process vessels have thin and/or heat conductive walls. An advantage of this arrangement is that the processing liquid within the process vessel receives heat from or dissipates heat to the region external to the process vessel to offset the heat lost or gained by the processing liquid at its free surface and/or through contact with the microelectronic workpiece. Therefore, the temperature of the processing liquid, and in particular the temperature of the processing liquid at the interface with the microelectronic workpiece, is maintained at a stable level for uniform processing results. Another advantage of this arrangement is that by maintaining the processing liquid at a uniform temperature, high and/or low temperature zones can be reduced and/or eliminated, which can reduce the likelihood for plating conductive materials out of the processing liquid.

Another feature of embodiments of the process station described above with reference to FIGS. 1-9 is that a heat transfer device is positioned immediately adjacent to the process vessel to transfer heat to or from the process vessel in a region close to the interface between the processing liquid and the microelectronic workpiece. An advantage of this arrangement is that the temperature of the processing liquid at this interface can more accurately be controlled. In a particular embodiment, the heat transfer device also receives processing liquid exiting the process vessel. An advantage of this arrangement is that the heat transfer device not only heats or cools the processing liquid in close proximity to the processing liquid/microelectronic workpiece interface (as described above), but also serves as a reservoir for the processing liquid.

The foregoing features are particularly advantageous when the processes performed on the microelectronic workpiece are highly temperature sensitive. One example of such a process is the electroless deposition of conductive materials onto the microelectronic workpiece. One particular example is plating a barrier metal (such as cobalt, nickel or alloys thereof) on a patterned (e.g., post-chemical-mechanical planarization) microelectronic workpiece. Another particular example includes depositing blanket layers and/or fill layers of conductive materials onto the microelectronic workpiece. Because the chemical stability of electroless processing liquids and the deposition rate of electrolessly deposited materials both tend to be highly temperature sensitive, superior results are obtained by accurately controlling the temperature of the processing liquid. In other processes, such as electrolytic deposition processes, accurately controlling the temperature of the processing liquid is also advantageous. For example, although the electrolytic processing liquids may remain stable at a wide range of temperatures, the rate at which these liquids apply material to the microelectronic workpieces can be temperature dependent. Accordingly, the rate (and therefore, potentially, the uniformity) with which materials are electrolytically applied to the microelectronic workpieces can be controlled by controlling the temperature through heating and/or cooling of the electrolytic processing liquids.

In other embodiments, apparatuses generally similar to those described above with reference to FIGS. 1-9 are used in other processes for treating microelectronic workpieces. Such processes include cleaning and/or etching the workpiece, and/or depositing and/or removing materials other than conductive materials (such as photoresist) from the microelectronic workpiece.

B. Flow Diffusers for Processing Liquids

Figure 10:
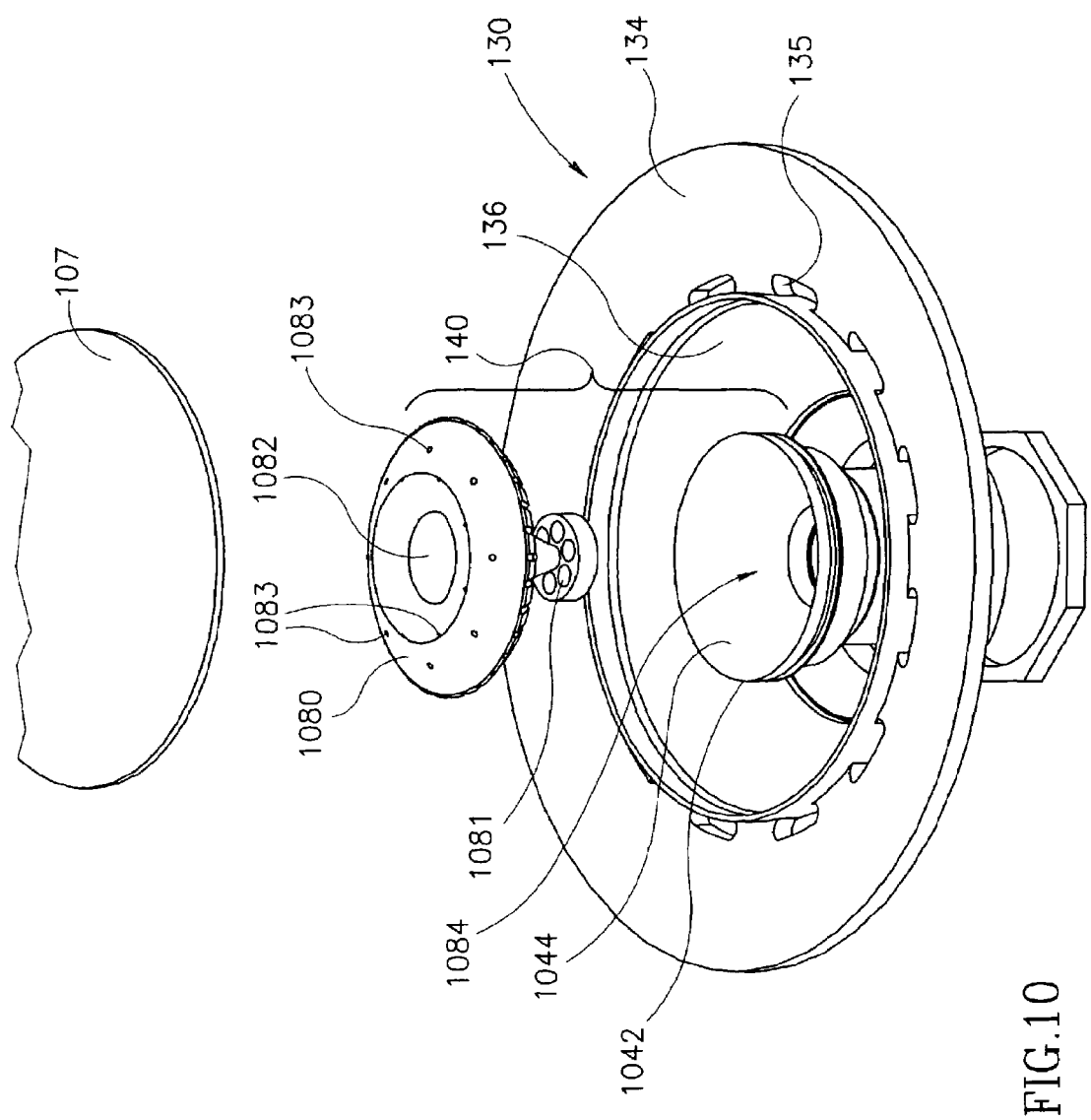
FIG. 10 is a partially exploded, top isometric view of a flow diffuser in accordance with another embodiment of the invention.

FIG. 10 is a partially exploded, isometric illustration of a diffuser 140 positioned in a process vessel 130 in accordance with an embodiment of the invention. In one aspect of this embodiment, the diffuser 140 includes a diffuser body 1080 removably positioned in a diffuser cup 1042. The diffuser cup 1042 includes a cup wall 1044 that together with the diffuser body 1080 defines a plenum 1084 for liquid entering the diffuser body 1080 through entrance ports 1081. The processing liquid proceeds through the diffuser body 1080 and exits through a primary exit port 1082 and one or more secondary exit ports 1083. Accordingly, the diffuser body 1080 directs the processing liquid toward the microelectronic workpiece 107. In a particular aspect of this embodiment, the processing liquid is an electroless processing liquid and is accordingly directed to the microelectronic workpiece 107 in the absence of any electrodes.

Figure 11:
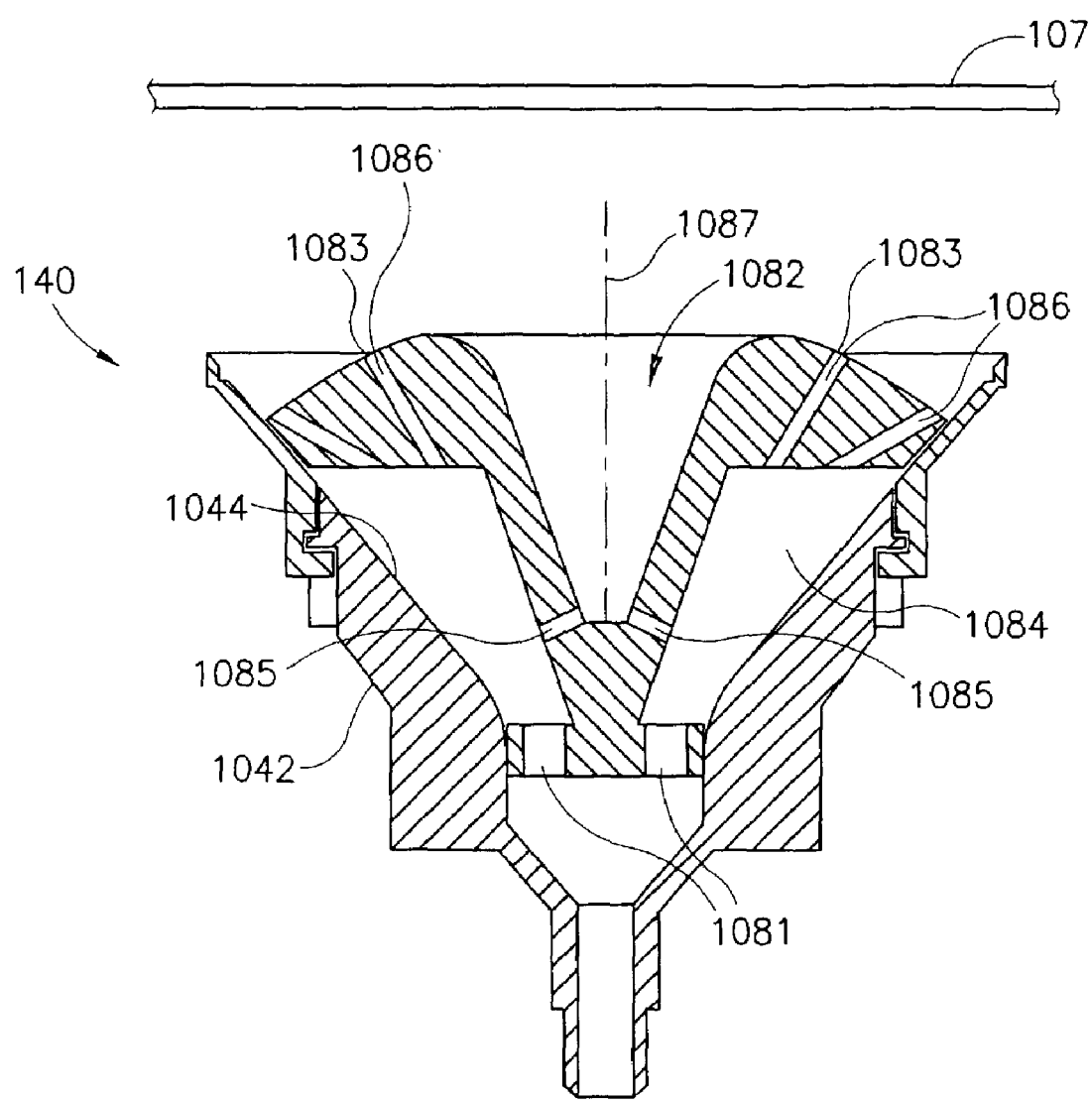
FIG. 11 is a cross-sectional, elevational view of a diffuser generally similar to that shown in FIG. 10.

FIG. 11 is a cross-sectional view of an embodiment of the diffuser 140 shown in FIG. 10. In one aspect of this embodiment, the processing liquid proceeds through one or more entrance ports 1081 into the plenum 1084. One portion of the processing liquid in the plenum 1084 proceeds through primary flow passages 1085 to the primary exit port 1082. Another portion of the processing liquid proceeds through secondary flow passages 1086 to secondary exit ports 1083.

In one aspect of this embodiment, the diffuser body 1080 includes a plurality of primary flow passages 1085 arranged in pairs so that opposing primary flow passages 1085 direct their respective portions of the processing liquid toward each other. An advantage of this feature is that the flow passing through the primary exit port 1082 can be more uniform than if the flow passing through the primary flow passages 1085 were to impinge directly on other structures, such as the opposing walls of the primary exit port 1082.

In one embodiment, the entrance port or ports 1081, the primary flow passages 1085, and the secondary flow passages 1086 have generally circular cross-sectional shapes. In other embodiments, these features can have arcuate or slot-type shapes. In any of these embodiments, a substantial portion of the flow proceeding from the plenum 1084 toward the microelectronic workpiece 107 proceeds through the primary exit port 1082. For example, in one aspect of this embodiment, from about 20% to about 50% of the total amount of processing liquid proceeds through the primary exit port 1082. Accordingly, the flow area of the primary exit port 1082 is from about 20% to about 50% of the total flow area of the primary exit port 1082 and all the secondary exit ports 1083.

Another aspect of this embodiment is that the secondary flow passages 1086 and the secondary exit ports 1083 are canted outwardly from a central axis 1087 of the primary exit port 1082. An advantage of the foregoing features is that the flow impinging on the microelectronic workpiece 107 is less likely to impinge in the form of discrete jets, and is more likely to impinge in the form of a uniform upwelling. This advantage can be particularly significant for temperature-dependent processes and/or other processes for which the characteristics of the processing liquid at the interface with the microelectronic workpiece 107 (characteristics such as flow velocity and temperature) are to be uniform for the desired process results.

C. Pre- and/or Post-Heating and/or Cooling the Microelectronic Workpiece

Figure 12:
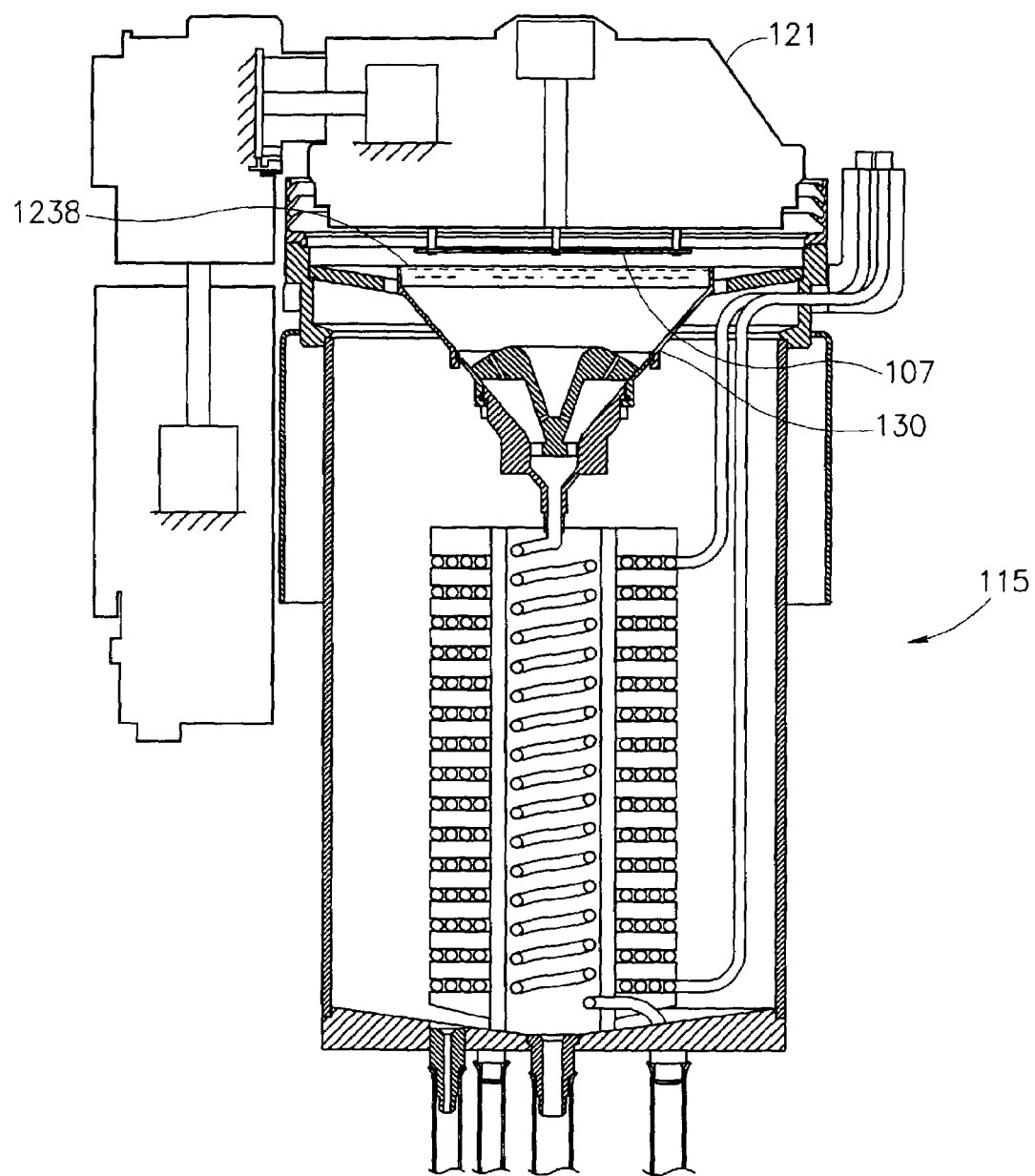
FIG. 12 is a cross-sectional, elevation view of a process station carrying a microelectronic workpiece in accordance with an embodiment of the invention.

FIG. 12 is a partially schematic illustration of the process station 115 described above with reference to FIG. 2, positioned to pre-heat, pre-cool, post-heat, and/or post-cool the microelectronic workpiece 107 in accordance with an embodiment of the invention. In one aspect of this embodiment, for example, when the processing liquid in the process vessel 130 is heated above the ambient temperature and above the initial temperature of the microelectronic workpiece 107, the microelectronic workpiece 107 is pre-heated before contacting the processing liquid. Accordingly, the head 121 supports the microelectronic workpiece 107 in a spaced-apart position relative to a free surface 1238 of the processing liquid within the process vessel 130 to allow the microelectronic workpiece 107 to approach and/or attain thermal equilibrium before contacting the processing liquid.

In one aspect of this embodiment, the head 121 remains motionless for a selected period of time until the microelectronic workpiece 107 is at or near the temperature of the processing liquid within the process vessel 130. For example, in a particular embodiment, the head 121 remains motionless for a period of time ranging from a few seconds to 60 seconds or longer. In another embodiment, the head 121 moves downwardly at a rate that is slow enough to allow the microelectronic workpiece 107 to approach or attain thermal equilibrium with the processing liquid prior to contacting the processing liquid. A feature of either embodiment is that the microelectronic workpiece 107 will be less likely to thermally shock the processing liquid when it comes into contact with the processing liquid. Accordingly, the processing liquid will be maintained at a more consistent temperature during processing, which will improve the quality and/or uniformity of the results obtained during the ensuing process.

In another embodiment, the foregoing steps are reversed to cool the microelectronic workpiece 107 in a controlled manner after the microelectronic workpiece has contacted the processing liquid. In one aspect of this embodiment, the microelectronic workpiece 107 is held stationary over the process vessel 130, or is moved slowly away from the process vessel 130, allowing the microelectronic workpiece 107 to more gradually come into thermal equilibrium with the environment surrounding the process vessel 130.

In one aspect of the foregoing embodiments described above with reference to FIG. 12, the microelectronic workpiece 107 is positioned above the process vessel 130 before processing to pre-heat the microelectronic workpiece 107, and/or after processing to cool the microelectronic workpiece 107. In another embodiment, for example, when the processing liquid within the process vessel 130 is at a temperature below ambient, the same technique is used to pre-cool the microelectronic workpiece 107 before processing and/or allow the microelectronic workpiece 107 to elevate in temperature after processing.

Figure 13:
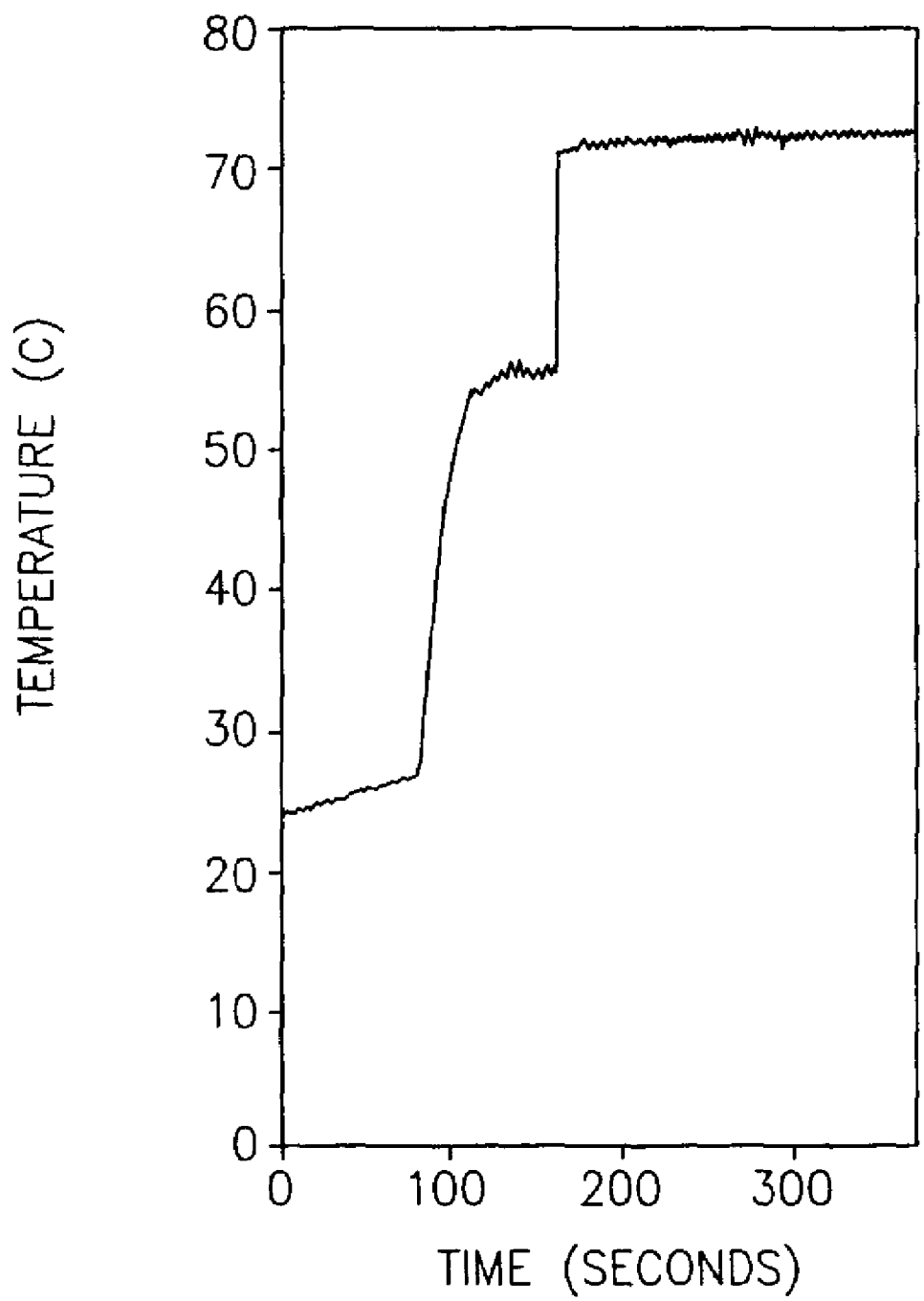
FIG. 13 is a graph illustrating results obtained by controlling the motion of a microelectronic workpiece in accordance with an embodiment of the invention.

FIG. 13 is a graph illustrating the average temperature of the microelectronic workpiece 107 as a function of time when pre-heating the microelectronic workpiece 107 in a manner generally similar to that described above with reference to FIG. 12. Referring now to FIGS. 12 and 13, in one embodiment, the microelectronic workpiece 107 is positioned face-up in the head 121 from time T=0 to about T=90 seconds. At T=90 seconds, the head 121 rotates to invert the microelectronic workpiece 107 and position it proximate to, but spaced apart from, the processing liquid. From T=90 seconds to approximately T=150 seconds, the microelectronic workpiece remains positioned above the processing liquid. During this time, the microelectronic workpiece 107 increases in temperature from about 25° C. to about 55° C. At about T=150 seconds, the microelectronic workpiece is lowered into contact with the processing liquid for processing at a temperature of about 72° C. In other embodiments, the time segments described above (e.g., from T=0 seconds to T=90 seconds, and from T=90 seconds to T=150 seconds) are significantly reduced to reduce the overall processing time, while still allowing the microelectronic workpiece to pre-heat and/or pre-cool.

D. Controlling Workpiece Temperature Uniformity and/or Deposition Uniformity

Figure 14A:
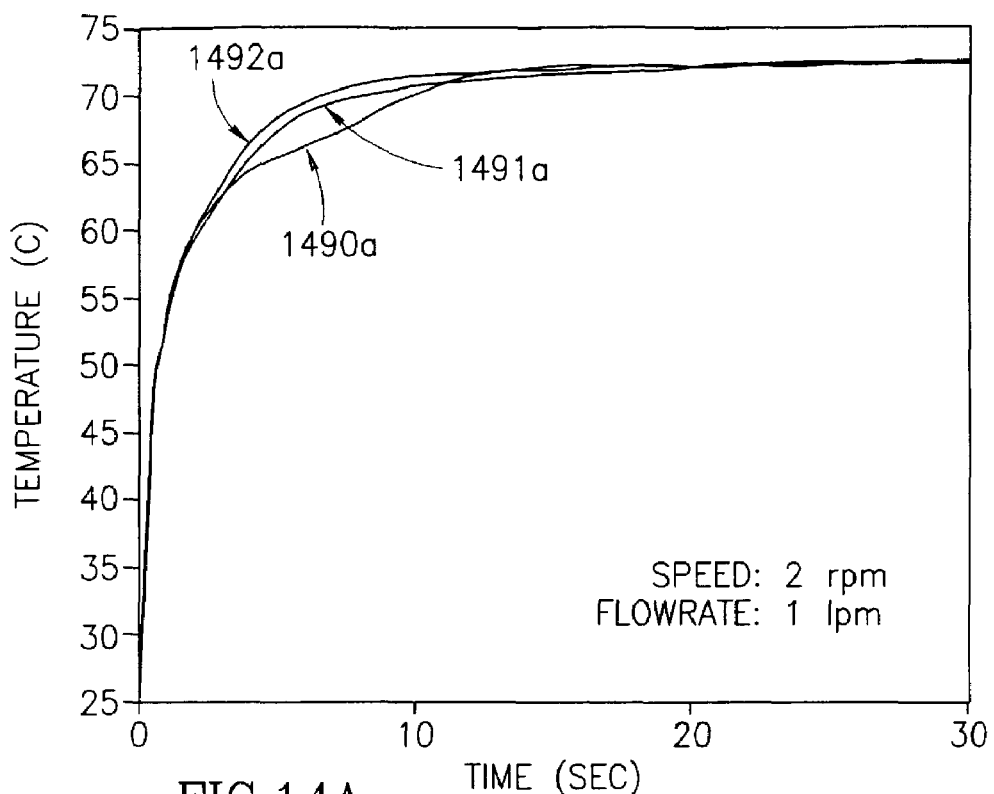
FIGS. 14A-14C illustrate predicted results obtained by controlling microelectronic workpiece rotation rates in accordance with still further embodiments of the invention.
Figure 14B:
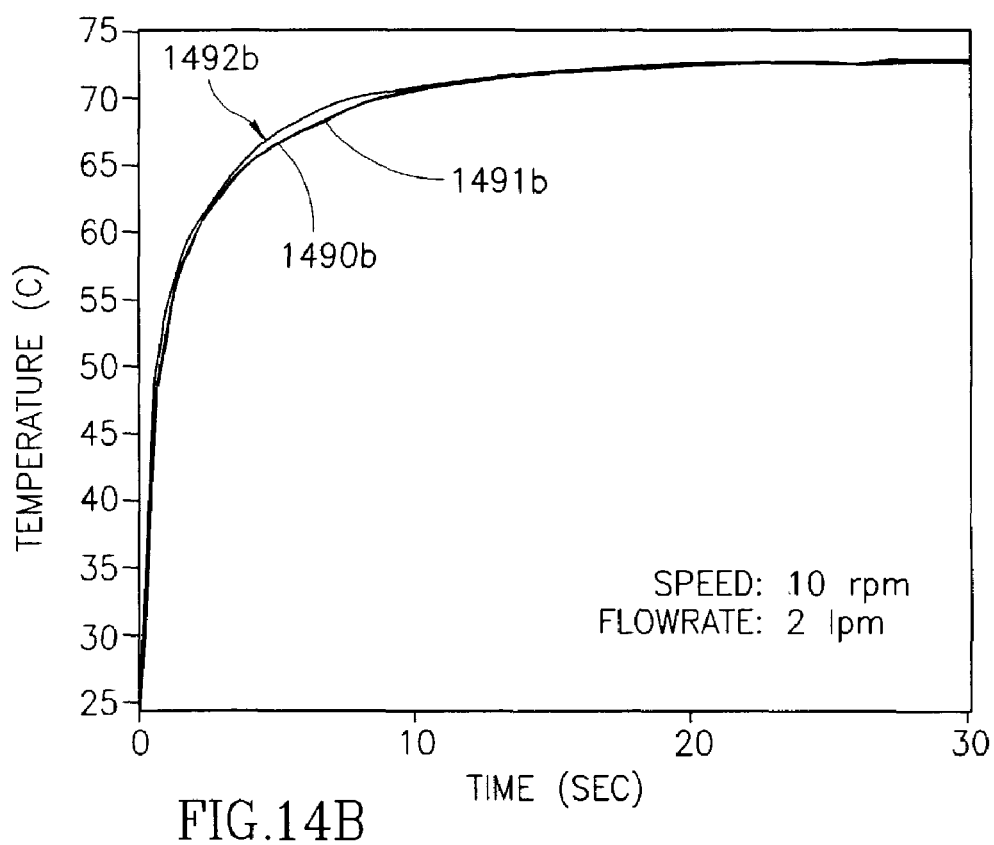
Figure 14C:
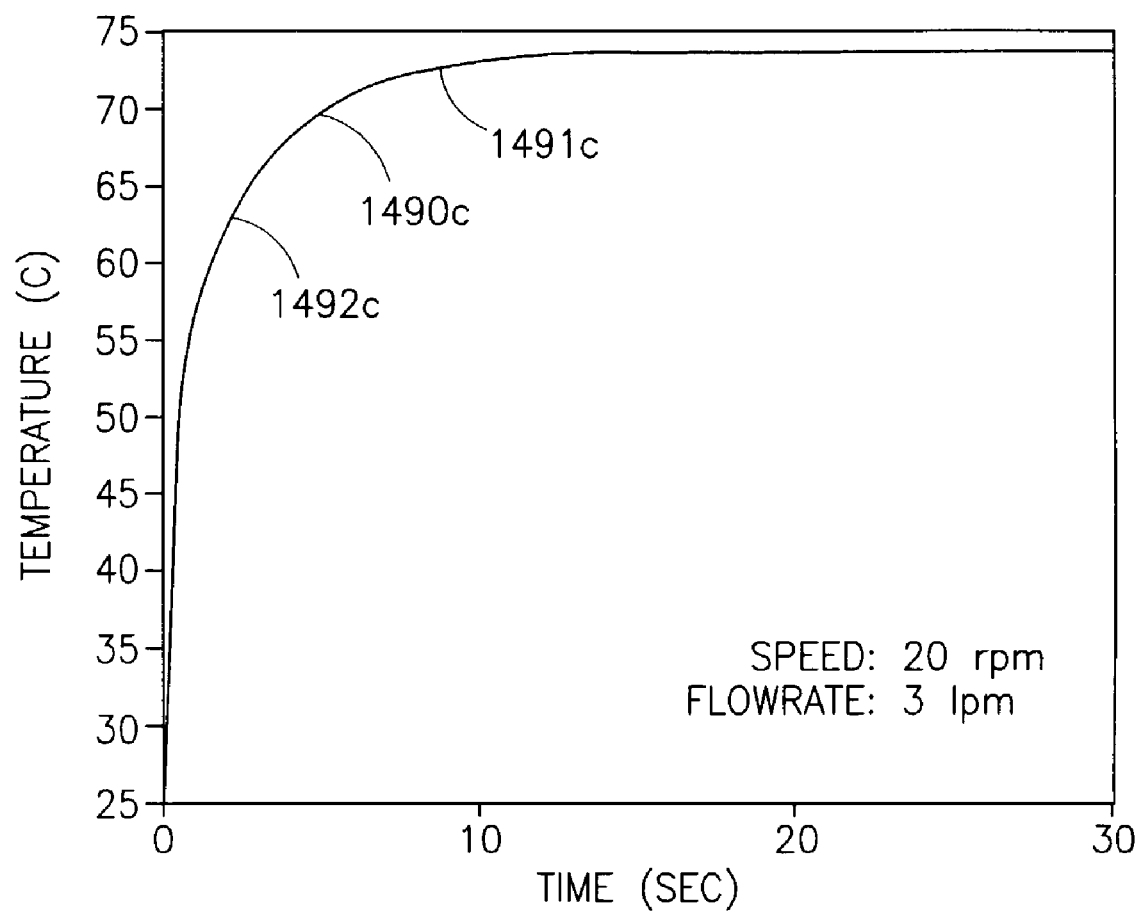

In a method in accordance with another embodiment of the invention, the rate at which the microelectronic workpiece 107 (FIG. 2) is rotated while in contact with the processing liquid, can be controlled to control the temperature and/or temperature distribution at the surface of the microelectronic workpiece 107. FIGS. 14A-14C illustrate numerical simulation results predicting an increase in temperature uniformity across the surface of the microelectronic workpiece 107 as the rotation speed is increased. The simulation includes increasing the rate at which the processing liquid is provided to the surface of the microelectronic workpiece 107 to account for the centrifugal pumping effect caused by the rotating microelectronic workpiece.

FIG. 14A illustrates predicted results for a microelectronic workpiece rotation speed of 2 rpm and a processing liquid flow rate of one liter per minute. Line 1490a indicates the temperature response as a function of time at the edge of the microelectronic workpiece 107 as the microelectronic workpiece 107 contacts the processing liquid. Line 1492a indicates the temperature response at the center of the microelectronic workpiece 107, and line 1491a indicates the temperature response at a point midway between the edge and the center of the microelectronic workpiece 107.

FIG. 14B illustrates the predicted results for a workpiece rotation speed of 10 rpm and a processing liquid flow rate of two liters per minute. As shown in FIG. 14B, the temperature response at the microelectronic workpiece edge and midpoint (lines 1490b and 1491b, respectively) have collapsed on each other and both approach the temperature response at the workpiece center (line 1492b). As shown in FIG. 14C, the response at all three regions of the microelectronic workpiece 107 (indicated by lines 1490c, 1491c, and 1492c) collapse on each other at a workpiece rotation speed of 20 rpm and a processing liquid flow rate of three liters per minute.

One feature of an embodiment of the method described above with reference to FIGS. 14A-14C is that the temperature at the surface of the microelectronic workpiece 107 can more quickly and uniformly be brought to a constant value by increasing the rate at which the microelectronic workpiece 107 is rotated. In one aspect of this embodiment, the rotation speed can be elevated to 20 rpm to enhance the uniformity of the temperature response. In other embodiments, for example, when the processing liquid has other temperatures and/or other characteristics, other rotation speeds are used to achieve the same or similar results. In any of these embodiments, the rotation speed can initially be relatively high (for example, until the microelectronic workpiece attains or at least approaches thermal equilibrium with the processing liquid) and then reduced, for example, when a lower rotation speed is more suitable for the ensuing process.

E. Controlling Mass-Transport Uniformity and/or Deposition Uniformity With Rotation Speed A method in accordance with another embodiment of the invention includes controlling the characteristics, such as the distribution, of material deposited onto the microelectronic workpiece 107 (FIG. 2) by controlling the rate at which the microelectronic workpiece 107 rotates while in contact with the processing liquid. In one aspect of this embodiment, the thickness profile of the material applied to the microelectronic workpiece 107 is controlled by controlling the microelectronic workpiece rotation rate. For example, in one specific embodiment, the rate at which the microelectronic workpiece 107 is rotated is controlled to apply material uniformly to the microelectronic workpiece 107, or to apply material more rapidly to either the center or the periphery of the workpiece 107. In one example of this embodiment, a microelectronic workpiece 107 having a diameter of 200 millimeters is rotated at very low speeds (such as 1 rpm), to apply material more rapidly at the center of the workpiece 107 than at the edge of the workpiece 107. As the rotation rate of the workpiece increases, the uniformity of the material application rate also increases until, at an intermediate rotating speed (for example, about 50 rpm), the material is applied at a uniform rate across the workpiece 107. As the rotation rate is further increased, the material applies more rapidly to the peripheral region of the workpiece 107 than to the central region of the workpiece 107, for example, at rotation speeds of about 100 rpm.

In one aspect of the foregoing embodiment, an electroless deposition solution for a cobalt alloy (such as an alloy including cobalt, tungsten and phosphorous) is applied in an electroless process at about 73° C., at a rate of from about 0.5 lpm to about 1 lpm. In other embodiments, the method includes selecting different chemical compositions, different flow rates (for example, up to about 5 lpm) and/or rotation speeds to preferentially apply different materials and/or preferentially apply materials to different portions of the microelectronic workpiece 107.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An apparatus for processing a microelectronic workpiece, comprising:
   a first vessel configured to carry a processing liquid, the first vessel having an inlet positioned to receive the processing liquid, the first vessel further having an exit positioned to pass the processing liquid exiting the first vessel;
   a second vessel within which the first vessel is positioned so as to be at least partially immersible in, and in thermal communication with, the processing liquid that is received into a first region, the first region being located within the second vessel and between the first and second vessels, and the second vessel having an inlet positioned to receive the processing liquid; and
   a heat exchanger positioned in the first region and connected to the second vessel inlet and to the first vessel inlet, the heat exchanger being in thermal communication with the processing liquid received into the first region such that the processing liquid flowing from the second vessel inlet through the heat exchanger to the first vessel inlet will be in thermal communication with the processing liquid within the first region.

2. The apparatus of claim 1 wherein the first vessel has a thermally transmissive vessel wall configured to transfer heat between the first region and a second region internal to the first vessel.

3. The apparatus of claim 1 wherein the heat exchanger device includes a coil disposed at least proximate to the first vessel, the coil being coupleable to a source of a heat transfer fluid.

4. The apparatus of claim 1 wherein the heat transfer device includes an electrical resistance heater positioned at least proximate to the first vessel.

5. The apparatus of claim 1 wherein the first vessel is configured to carry the processing liquid with the processing liquid including an electroless processing liquid.

6. The apparatus of claim 1, further comprising a diffuser positioned at least proximate to the first vessel inlet, wherein the diffuser has at least one entrance port, a plenum region in fluid communication with the at least one entrance port, a primary exit port located annularly inwardly from the plenum region, at least one primary flow passage coupled between the plenum region and the primary exit port, at least one secondary exit port located annularly outwardly from the primary exit port, and at least one secondary flow passage coupled between the plenum region and the at least one secondary exit port.

7. The apparatus of claim 1, further comprising a support member movably positioned proximate to the first vessel, the support member having at least one carrier member positioned to carry the microelectronic workpiece, the support member being movable relative to the first vessel between a first position with the support member oriented to carry the microelectronic workpiece spaced apart from processing liquid in the first vessel, and a second position with the support member oriented to carry the microelectronic workpiece in contact with processing liquid in the first vessel.

8. The apparatus of claim 1, further comprising a support member positioned at least proximate to the first vessel, the support member having at least one support portion positioned to contact an edge of the microelectronic workpiece while a first surface of the microelectronic workpiece contacts the processing liquid and a central portion of a second surface of the microelectronic workpiece facing opposite from the first surface is spaced apart from the support member.

9. The apparatus of claim 1, further comprising a support member positioned at least proximate to the first vessel, the support member having at least one support portion positioned to contact an edge of the microelectronic workpiece while a first surface of the microelectronic workpiece contacts the processing liquid and the entirety of a second surface of the microelectronic workpiece facing opposite from the first surface is spaced apart from the support member.

10. The apparatus of claim 1 wherein the second vessel is positioned so processing liquid that is received in the second vessel is received after overflowing a weir of the first vessel.

11. The apparatus of claim 1, wherein the heat exchanger includes:
a convoluted supply conduit coupled to the first vessel inlet, the convoluted supply conduit being in thermal communication with the processing liquid in the second vessel so that the processing liquid proceeding through the convoluted supply conduit to the first vessel receives heat from the processing liquid in the second vessel, and wherein the apparatus further comprises a rinse device positioned above the first vessel to rinse the microelectronic workpiece.

12. The apparatus of claim 1 wherein:
the second vessel includes a reservoir positioned around and below the first vessel;
the heat exchanger includes a first supply conduit coupled to the first vessel inlet; and
the second vessel includes a second supply conduit and a drain positioned toward the bottom of the reservoir.

13. The apparatus of claim 12 wherein the drain is coupled to the second supply conduit to deliver at least a portion of the processing liquid removed through the drain back to the reservoir through the second supply conduit.

14. The apparatus of claim 12 wherein the first supply conduit passes through the reservoir and is in thermal contact with processing liquid located in the reservoir.

15. The apparatus of claim 12 wherein the first supply conduit includes a coiled conduit passing through the reservoir in thermal contact with processing liquid located in the reservoir.

16. The apparatus of claim 12 wherein the heat exchanger is coupled to a supply of heat exchange fluid, the heat exchanger including a coiled heat exchanger conduit positioned within the reservoir and in thermal communication with processing liquid located within the reservoir.

17. The apparatus of claim 12 wherein the drain is coupled to both the first supply conduit and the second supply conduit, and wherein the apparatus further comprises a valve positioned to direct a first portion of the flow removed through the drain into the first supply conduit, and direct a second portion of the flow removed through the drain into the second supply conduit.

18. The apparatus of claim 12 wherein the drain is coupled to both the first supply conduit and the second supply conduit, and wherein the apparatus further comprises a valve positioned to direct a first portion of the flow removed through the drain into the first supply conduit, and direct a second portion of the flow removed through the drain into the second supply conduit, and wherein the heat exchanger is coupled to a supply of heat exchange fluid, the heat exchanger including a coiled heat exchanger conduit positioned within the reservoir and in thermal communication with processing liquid located within the reservoir.

19. The apparatus of claim 12 wherein the first supply conduit includes a coiled conduit passing through the reservoir in thermal contact with processing liquid located in the reservoir, and wherein the heat exchanger is coiled within the reservoir and in thermal communication with processing liquid located within the reservoir.

20. An apparatus for processing a microelectronic workpiece, comprising:
a first vessel configured to carry a processing liquid, the first vessel having an exit portion positioned to pass at least a portion of the processing liquid from the first vessel;
a second vessel, wherein the first vessel is positioned within the second vessel so as to be partially immersible in, and in thermal communication with, the processing liquid that is received in the second vessel from the first vessel; and
a diffuser positioned at least proximate to an entrance portion of the first vessel, wherein the diffuser has at least one entrance port, a plenum region in fluid communication with the at least one entrance port, a primary exit port disposed annularly inwardly from the plenum region, at least one primary flow passage coupled between the plenum region and the primary exit port, at least one secondary exit port disposed annularly outwardly from the primary exit port, and at least one secondary flow passage coupled between the plenum region and the at least one secondary exit port.

21. The apparatus of claim 20, further comprising a flow passage coupled between the first vessel and the second vessel to transfer the processing liquid from the second vessel to the first vessel.

22. The apparatus of claim 20 wherein the first vessel includes a first vessel wall and wherein the second vessel is positioned to carry the processing liquid in thermal contact with the first vessel wall.

23. The apparatus of claim 20 wherein the first vessel is configured to support the processing liquid with the processing liquid including an electroless processing liquid.

24. The apparatus of claim 20, further comprising a heat exchanger in thermal communication with at least one of the first and second vessels.

25. The apparatus of claim 20, further comprising a heat exchanger in thermal communication with the second vessel, and wherein the heat exchanger includes a resistive electrical heater disposed in the second vessel.

26. The apparatus of claim 20, further comprising a heat exchanger in thermal communication with the second vessel, and wherein the heat exchanger includes a fluid conduit disposed in the second vessel, the fluid conduit being coupleable to a source of heat transfer fluid.

27. The apparatus of claim 20 wherein the exit portion of the first vessel is a first exit portion and wherein the first vessel includes a first entrance portion, further wherein the second vessel includes a second entrance portion and a third entrance portion with the second entrance portion positioned to receive processing liquid from the first vessel, and wherein the apparatus further comprises a flow passage coupled between the second exit portion of the second vessel, the third entrance portion of the second vessel and the first entrance portion of the first vessel, the flow passage including a valve configured to direct a first portion of the processing liquid exiting the second vessel into the first vessel and direct a second portion of the processing liquid exiting the second vessel back into the second vessel.

28. The apparatus of claim 20, further comprising a flow passage coupled between the first vessel and the second vessel to transfer the processing liquid from the second vessel to the first vessel, wherein the flow passage includes a portion positioned within the second vessel, and wherein the portion of the flow passage within the second vessel follows a convoluted path.

29. The apparatus of claim 20 wherein the first vessel has a heat transmissive wall configured to transfer heat from or to the processing liquid in the second vessel to or from the processing liquid in the first vessel.

30. The apparatus of claim 20, further comprising a support member movably positioned proximate to the first vessel, the support member having at least one carrier member positioned to carry the microelectronic workpiece, the support member being movable relative to the first vessel between a first position with the support member oriented to carry the microelectronic workpiece spaced apart from processing liquid in the first vessel, and a second position with the support member oriented to carry the microelectronic workpiece in contact with processing liquid in the first vessel.

31. A tool for processing a microelectronic workpiece, comprising:
an input/output station positioned to receive microelectronic workpieces;
a plurality of processing stations proximate to the input/output station; and
a transfer device positioned to move microelectronic workpieces among the processing stations, wherein at least one of the processing stations includes:
a first vessel configured to carry a processing liquid, the first vessel having an inlet positioned to receive the processing liquid, the first vessel further having an exit positioned to pass the processing liquid exiting the first vessel;
a second vessel within which the first vessel is positioned so as to be at least partially immersible in, and in thermal communication with, the processing liquid that is received into a first region, the first region being located within the second vessel and between the first and second vessels, and the second vessel having an inlet positioned to receive the processing liquid; and
a heat exchanger positioned in the first region and connected to the second vessel inlet and to the first vessel inlet, the heat exchanger being in thermal communication with the processing liquid received into the first region such that the processing liquid flowing from the second vessel inlet through the heat exchanger to the first vessel inlet will be in thermal communication with the processing liquid within the first region.

32. The tool of claim 31 wherein at least another of the processing chambers is configured to clean, etch, measure and/or anneal the microelectronic workpiece.

33. A tool for processing a microelectronic workpiece, comprising:
an input/output station positioned to receive microelectronic workpieces;
a plurality of processing stations proximate to the input/output station; and
a transfer device positioned to move microelectronic workpieces among the processing stations, wherein a first processing station includes:
a first vessel configured to carry a first processing liquid, the first vessel having an inlet positioned to receive the first processing liquid and an exit positioned to pass at least a portion of the first processing liquid from the first vessel;
a second vessel within which the first vessel is positioned so as to be partially immersible in, and in thermal communication with, the first processing liquid that is received into the second vessel from the exit portion of the first vessel, the second vessel having an inlet; and
a heat exchanger positioned between the first and second vessels, the heat exchanger being connected between the inlet of the first vessel and the inlet of the second vessel and being in thermal communication with the first processing liquid received in the second vessel so that first processing liquid flowing from the second vessel inlet through the heat exchanger to the first vessel inlet will be in thermal communication with first processing liquid in the second vessel; and
wherein a second processing station includes:
a third vessel configured to carry a second processing liquid, the third vessel having an inlet positioned to receive the second processing liquid and an exit positioned to pass at least a portion of the second processing liquid from the third vessel;
a fourth vessel within which the third vessel is positioned so as to be partially immersible in, and in fluid communication with, the second processing liquid that is received into the fourth vessel from the exit of the third vessel, the fourth vessel having an inlet; and
a heat exchanger positioned between the third and fourth vessels, the heat exchanger being connected between the inlet of the third vessel and the inlet of the fourth vessel and being in thermal communication with the second processing liquid received in the fourth vessel so that second processing liquid flowing from the fourth vessel inlet through the heat exchanger to the third vessel inlet will be in thermal communication with second processing liquid in the fourth vessel.

34. The tool of claim 33 wherein the first vessel includes a first vessel wall and wherein the second vessel is positioned to carry the first processing liquid in thermal contact with the first vessel wall.

35. The tool of claim 33 wherein the first vessel is configured to support the first processing liquid with the first processing liquid including an electroless processing liquid.

36. The tool of claim 33 wherein the second vessel is coupled in fluid communication with the fourth vessel.

37. The tool of claim 33 wherein the first and second vessels are configured to carry a first processing liquid different than the second processing liquid.

38. A diffuser for a microelectronic workpiece processing station, comprising a diffuser body having at least one entrance port, a plenum region in fluid communication with the at least one entrance port, a primary exit port disposed annularly inwardly from the plenum region, at least one primary flow passage coupled between the plenum region and the primary exit port, at least one secondary exit port disposed annularly outwardly from the primary exit port, and at least one secondary flow passage coupled between the plenum region and the at least one secondary exit port, the at least one secondary exit port being smaller than the primary exit port.

39. The diffuser of claim 38 wherein the primary exit port has a first flow area and the at least one secondary exit port has a second flow area, further wherein the first flow area is at least about 20% of a total flow area for the primary exit port and the at least one secondary exit port together.

40. The diffuser of claim 38 wherein the at least one secondary exit port is one of a plurality of secondary exit ports, further wherein the primary exit port has a first flow area and the plurality of secondary exit ports has a combined second flow area, still further wherein the first flow area is from about 20% to about 50% of a total flow area for the primary exit port and the plurality of secondary exit ports together.

41. The diffuser of claim 38 wherein the primary exit port is the only primary exit port of the diffuser body.

42. The diffuser of claim 38, further comprising a cup disposed outwardly from the diffuser body, wherein the cup has an inwardly facing wall and the diffuser body has an outwardly facing wall, further wherein the inwardly facing wall and the outwardly facing wall together form at least a portion of the plenum.

43. The diffuser of claim 38 wherein the at least one primary flow passage is one of a plurality of primary flow passages disposed circumferentially around the primary exit port, each primary flow passage having a first opening in fluid communication with the plenum and a second opening in fluid communication with the exit port.

44. The diffuser of claim 38 wherein the diffuser body includes a convex, curved surface extending radially outwardly from the primary exit port.

45. The diffuser of claim 38 wherein the at least one secondary exit port is inclined outwardly relative to the primary exit port.

46. The diffuser of claim 38 wherein the at least one primary flow passage includes a plurality of primary flow passages coupled between the plenum region and the primary exit port, further wherein each primary flow passage has an opening at the primary exit port, and wherein pairs of the openings face toward each other.

47. A station for processing microelectronic workpieces, comprising:
 a vessel configured to carry a processing liquid, the vessel having an entrance portion positioned to receive the processing liquid, the vessel further having an exit portion positioned to pass the processing liquid exiting the vessel, the vessel having a thermally transmissive vessel wall configured to transfer heat between a first region external to the vessel and a second region internal to the vessel;
 a heat transfer device positioned in the first region, the heat transfer device being thermally coupled to the vessel wall to transfer heat to or from the vessel wall; and
 a diffuser positioned in fluid communication with the entrance portion of the vessel, the diffuser including a diffuser body having at least one entrance port, a plenum region in fluid communication with the at least one entrance port, a primary exit port disposed annularly inwardly from the plenum region, at least one primary flow passage coupled between the plenum region and the primary exit port, at least one secondary exit port disposed annularly outwardly from the primary exit port, and at least one secondary flow passage coupled between the plenum region and the at least one secondary exit port, the at least one secondary exit port being smaller than the primary exit port.

48. The station of claim 47 wherein the vessel is a first vessel, wherein the heat transfer device includes a second vessel, and wherein the first vessel is positioned within the second vessel so as to be partially immersible in, and in thermal communication with, processing liquid that is received in the second vessel from the first vessel.

49. The station of claim 47 wherein the primary exit port has a first flow area and the at least one secondary exit port has a second flow area, further wherein the first flow area is at least about 20% of a total area for the primary exit port and the at least one secondary exit port together.

50. The station of claim 47 wherein the at least one secondary exit port is one of a plurality of secondary exit ports, further wherein the primary exit port has a first flow area and the plurality of secondary exit ports has a combined second flow area, still further wherein the first flow area is from about 20% to about 50% of a total flow area for the primary exit port and the plurality of secondary exit ports together.

51. The station of claim 47, further comprising a cup disposed outwardly from the diffuser body, wherein the cup has an inwardly facing wall and the diffuser body has an outwardly facing wall, further wherein the inwardly facing wall and the outwardly facing wall together form at least a portion of the plenum.

52. The station of claim 47 wherein the at least one primary flow passage is one of a plurality of primary flow passages disposed circumferentially around the primary exit port, each primary flow passage having a first opening in fluid communication with the plenum and a second opening in fluid communication with the exit port.

53. The station of claim 47 wherein the diffuser body includes a convex, curved surface extending radially outwardly from the primary exit port.

54. The station of claim 47 wherein the at least one secondary exit port is inclined outwardly relative to the primary exit port.

55. The station of claim 47 wherein the at least one primary flow passage includes a plurality of primary flow passages coupled between the plenum region and the primary exit port, further wherein each primary flow passage has an opening at the primary exit port, and wherein pairs of the openings face toward each other.

56. The station of claim 47 wherein the diffuser is not positioned proximate to an electrode and is configured to receive the processing liquid with the processing liquid including an electroless processing liquid.

57. A tool for processing a microelectronic workpiece, comprising:
 an input/output station positioned to receive microelectronic workpieces;
 a plurality of processing stations proximate to the input/output station; and
 a transfer device positioned to move microelectronic workpieces among the processing stations, wherein at least one of the processing stations includes:
  a vessel configured to carry a processing liquid, the vessel having an entrance portion positioned to receive the processing liquid, the vessel further having an exit portion positioned to pass the processing liquid exiting the vessel, the vessel having a thermally transmissive vessel wall configured to transfer heat between a first region external to the vessel and a second region internal to the vessel;
  a heat transfer device positioned in the first region, the heat transfer device being thermally coupled to the vessel wall to transfer heat to or from the vessel wall; and
  a diffuser positioned in fluid communication with the vessel, the diffuser including a diffuser body having at least one entrance port, a plenum region in fluid communication with the at least one entrance port, a primary exit port disposed annularly inwardly from the plenum region, at least one primary flow passage coupled between the plenum region and the primary exit port, at least one secondary exit port disposed annularly outwardly from the primary exit port, and at least one secondary flow passage coupled between the plenum region and the at least one secondary exit port, the at least one secondary exit port being smaller than the primary exit port.

58. The tool of claim 57 wherein the vessel is a first vessel and the heat transfer device includes a second vessel, and wherein the first vessel is positioned within the second vessel so as to be partially immersible in, and in thermal communication with, processing liquid that is received in the second vessel from the first vessel.

59. The tool of claim 57 wherein the primary exit port has a first flow area and the at least one secondary exit port has a second flow area, further wherein the first flow area is at least about 20% of a total area for the primary exit port and the at least one secondary exit port together.

60. The tool of claim 57 wherein the at least one secondary exit port is one of a plurality of secondary exit ports, further wherein the primary exit port has a first flow area and the plurality of secondary exit ports has a combined second flow area, still further wherein the first flow area is from about 20% to about 50% of a total flow area for the primary exit port and the plurality of secondary exit ports together.

61. The tool of claim 57, further comprising a cup disposed outwardly from the diffuser body, wherein the cup has an inwardly facing wall and the diffuser body has an outwardly facing wall, further wherein the inwardly facing wall and the outwardly facing wall together form at least a portion of the plenum.

62. The tool of claim 57 wherein the at least one primary flow passage is one of a plurality of primary flow passages disposed circumferentially around the primary exit port, each primary flow passage having a first opening in fluid communication with the plenum and a second opening in fluid communication with the exit port.

63. The tool of claim 57 wherein the at least one secondary exit port is inclined outwardly relative to the primary exit port.

64. The tool of claim 57 wherein the at least one primary flow passage includes a plurality of primary flow passages coupled between the plenum region and the primary exit port, further wherein each primary flow passage has an opening at the primary exit port, and wherein pairs of the openings face toward each other.

* * * * *